(12) United States Patent
Gadgil

(10) Patent No.: US 7,365,005 B1
(45) Date of Patent: Apr. 29, 2008

(54) METHOD FOR FILLING OF A RECESSED STRUCTURE OF A SEMICONDUCTOR DEVICE

(76) Inventor: Prasad N. Gadgil, 301 Rosemont Dr., Santa Clara, CA (US) 95051

( * ) Notice: Subject to any disclaimer, the term of this patent is extended or adjusted under 35 U.S.C. 154(b) by 0 days.

(21) Appl. No.: 11/159,999

(22) Filed: Jun. 22, 2005

Related U.S. Application Data

(63) Continuation-in-part of application No. 10/975,169, filed on Oct. 27, 2004, and a continuation-in-part of application No. 10/865,111, filed on Jun. 9, 2004, which is a continuation-in-part of application No. 10/019,244, filed on May 20, 2002, now Pat. No. 6,812,157.

(51) Int. Cl.
*H01L 21/4763* (2006.01)

(52) U.S. Cl. .............................. 438/637; 257/E21.585

(58) Field of Classification Search ............... 438/453, 438/617, 637; 257/E21.585, E21.589
See application file for complete search history.

(56) References Cited

U.S. PATENT DOCUMENTS

| | | | | |
|---|---|---|---|---|
| 4,058,430 | A | 11/1977 | Suntola et al. | 156/611 |
| 6,284,052 | B2 | 9/2001 | Nguyen et al. | 134/1 |
| 6,342,277 | B1 | 1/2002 | Sherman | 427/562 |
| 6,368,954 | B1 * | 4/2002 | Lopatin et al. | 438/627 |
| 6,416,822 | B1 | 7/2002 | Chiang et al. | 427/561 |
| 6,482,740 | B2 | 11/2002 | Soininen et al. | 438/686 |
| 6,551,929 | B1 | 4/2003 | Kori et al. | 438/685 |
| 6,635,965 | B1 | 10/2003 | Lee et al. | 257/758 |
| 6,812,157 | B1 | 11/2004 | Gadgil | 438/763 |
| 2006/0166448 | A1 * | 7/2006 | Cohen | 438/296 |
| 2006/0251800 | A1 * | 11/2006 | Weidman et al. | 427/99.5 |

OTHER PUBLICATIONS

J. W. Klaus et al., Journal of Electrochemical Society vol. 147, p. 1175-1181, Mar. 2000.
Chiang et al., Journal of Vacuum Science and Technology A, vol. 15 No. 5, p. 2677-2686 (1997).
Lakshmanan et al., Journal of Electrochemical Society vol. 145, p. 694-700, Feb. 1998.
Martensson et al., in the Journal of Electrochemical Society, vol. 145, p. 2926-2931, Aug. 1998.
Solanki et al., Electrochemical and Solid State Letters, vol. 3, No. 10, p. 479-480, 2000.

(Continued)

*Primary Examiner*—Bradley K Smith
(74) *Attorney, Agent, or Firm*—Stephen G. Sullivan

(57) ABSTRACT

This invention relates to process sequence by high-speed atomic layer chemical vapor processing that includes deposition for diffusion barriers in the etched features on substrate followed by gap fill and subsequent in-situ removal of the blanket films on the top by plasma enhanced vapor phase processes. The apparatus and process sequences employed in these processing scheme allows the practitioner to complete all vapor phase process sequences of diffusion barrier deposition, gap fill and planarization of copper and diffusion barrier planarization. In case of copper metallization scheme, vapor phase gap fill can be employed to replace electrochemical deposition of copper and removal of copper and the diffusion barrier by vapor phase reactions can replace chemical-mechanical-polishing. Furthermore, such a processing scheme can be employed to deposit gate level dielectric layer, shallow trench isolation and also to form first metal contact plugs with a suitable barrier at the front end of line processing.

1 Claim, 17 Drawing Sheets

OTHER PUBLICATIONS

Kew-Chan Shim et al., Journal of Electrochemical Society, vol. 149, No. 2, p. G109-G113, Feb. 2002.

Wrschka et al., Journal of Electrochemical Society, vol. 147, p. 706-712, Feb. 2000.

Lim et al., in Nature Materials, vol. 2, pp. 749-754 Nov. 2003.

Martensson et al., Chemical Vapor Deposition, vol. 3, No. 1, p. 45-50 (1997).

Andricacos; Electrochemical Society Interface, p. 32-37, Spring 1999.

T. Suntola titled Atomic Layer Epitaxy in the Handbook of Thin Film Process Technology, Part B 1.5, p. 1-17, IOP Publishing Limited, 1995.

Sangehon Lee and Yue Kuo in the Journal of Electrochemical Society, vol. 148, p. G524-G529, Sep. 2001.

Yao Zhi-Hu et al., Journal of Electrochemical Society, vol. 148, p. G669-G675, Dec. 2001.

Huo et al., Journal of Materials Research, vol. 17, No. 9, p. 2394-2398 (Sep. 2002).

Reyes-Betanzo et al., Journal of Electrochemical Society, vol. 149, No. 3, p. G179-G183 (2002).

V. J. Tu et al., Journal of Vacuum Science & Technology A, vol. 18, No. 6, p. 2799-2805 (2000).

* cited by examiner

METHOD FOR FILLING OF A RECESSED STRUCTURE OF A SEMICONDUCTOR DEVICE

CROSS-REFERENCE TO RELATED APPLICATIONS

This application is a continuation-in-part of U.S. application Ser. No. 10/865,111 filed on Jun. 9, 2004 and continuation-in-part of the U.S. patent application Ser. No. 10/975,169 filed Oct. 27, 2004; both of which are continuation-in-part of the application Ser. No. 10/019,244, filed May 20, 2002, now U.S. Pat. No. 6,182,157.

BACKGROUND OF THE INVENTION

1. Field of Invention

The present invention relates to thin film processing at a single atomic layer precision for manufacturing of semiconductor devices. More particularly, this invention describes a process sequence that can be performed in one or more atomic layer/chemical vapor processing reactors to enable fabrication of microelectronic devices by employing thin film materials processing at atomic level precision. Furthermore, the process sequence as described herein is applicable to a variety of configurations for deep sub-micron devices such as thin film barrier deposition, gap fill for metallization and their subsequent planarization to form metal plugs, shallow trench isolation and inter-metal dielectric layers among others.

2. Description of the Related Art

Manufacturing of advanced integrated circuits (ICs) the microelectronic industry is accomplished through numerous and repetitive steps of deposition, patterning and etching of thin films on the surface of silicon wafer. An extremely complex, monolithic and three-dimensional structure with complex topography of variety of thin film materials such as semiconductors, insulators and metals is generated in an IC fabrication process.

The present trend in the IC fabrication, which is going to continue in to the foreseeable future, is to increase the wafer size and simultaneously decrease the individual device dimensions. As an example, the silicon wafer size has progressed in recent years from 150 mm to 200 mm and now to 300 mm. At the same time, the individual device dimension has decreased from 0.35 micron to 0.25 micron to 0.18 micron and further to 0.13 micron and 0.10 micron is on the horizon. Research and development for the upcoming devices with even smaller device dimension is being aggressively conducted. This trend demands extremely precise control of the critical process parameters such as film thickness, morphology and particularly conformal step coverage over complex topography and uniformity over an increasingly large area wafer surface.

In a typical monolithic IC fabrication process three dimensional device structures are fabricated on the surface of a silicon wafer through a repetitive sequence of deposition, patterning and etching of the layers in a precisely controlled manner. The etched portions of the wafer are filled with an appropriate conducting material on which the next layer is built by employing a similar process sequence. The process sequence that forms at the back-end of the microelectronic devices where all the active devices on the silicon wafer are connected by conducting wiring of copper is called dual damascene multi-level metallization scheme. Copper offers significant advantage due to its low electrical resistivity (<2.0 $\mu\Omega.cm$) as compared to aluminum (~4.5 $\mu\Omega.cm$) in reducing resistance to electrical current.

However, copper tends to diffuse in to the adjacent layers of a dielectric material during operation of the circuit under the influence of electrical field and high temperatures generated due to large operational current densities. This can lead to short-circuiting two adjoining copper conductors and destruction of an active device. To avert this catastrophic end effect, but to retain the advantages copper can offer, it is clad in to a thin layer of diffusion resistant material called diffusion barrier.

In practice, to begin with a dielectric layer (preferably with low dielectric constant, hence called low-k) is deposited on to a planarized gate level dielectric layer. The planarized gate dielectric layer contains tungsten contact plugs that are normally filled by a chemical vapor deposition (CVD) process to establish electrical contact with the transistor. Next, the low-k dielectric layer is patterned and etched to open direct electrical contact to underlying tungsten plugs. Subsequently, a thin (~50 Å or 5 nm) copper diffusion barrier layer is deposited into the etched features to arrest copper diffusion. The diffusion barrier also deposits on the top surface of the wafer. The materials commonly employed as diffusion barriers are nitrides of transition metals such W, Ta, Ti and may contain their admixtures with silicon or carbon with recent entrants such as Ru and $RuO_2$. A thin copper seed layer, approximately 50-70 Å (5-7 nm), is deposited by sputtering or Physical Vapor Deposition (PVD). Subsequently, the as deposited silicon wafer is transferred in to an electrochemical cell, containing an aqueous solution of a copper salt as an electrolyte in which the silicon wafer, with a barrier layer and a copper seed layer, forms a cathode and a pure copper parallel plate forms an anode. An ensuing electrochemical reaction, under the application of electrical power, deposits copper metal in the etched portions on the wafer and fills them with copper metal. During the electrochemical deposition, however, copper also deposits on the top surface of the silicon wafer, between two adjacent contacts, which must be removed in order to obtain an exposed conducting pattern before the next level of low-k dielectric material is deposited. Thereafter, removal of excess copper on the top surface, along with the undesired diffusion barrier layer on the top surface of the wafer, is preferably achieved by a method called Chemical-Mechanical Polishing. Finally, a thin blanket layer of silicon nitride or silicon carbide (a few hundred Angstrom thin) is deposited on to the exposed copper plugs. These steps, beginning with the deposition of the low-k dielectric layer, are repeated desired number of times to build the multi-level metallization structure.

As an example of diffusion barrier deposition process, J. W. Klaus et al., in a paper published in the Journal of Electrochemical Society vol. 147, p. 1175-1181, March 2000; demonstrated deposition of tungsten nitride ($W_2N$) thin films as a copper diffusion barrier by atomic layer deposition process employing tungsten hexafluoride ($WF_6$) and ammonia ($NH_3$) between 300-500° C.

Thin films of copper for seed layer have been deposited by various chemical processes. Chiang et al., described an ion-induced chemical vapor deposition process for the deposition of thin copper films employing Cu(hfac)TMVS [copper hexa-fluoro-acetylacetonate trimethyl vinyl silane] as a copper precursor in hydrogen plasma, in Journal of Vacuum Science and Technology A, vol. 15 No. 5, p. 2677-2686 (1997). Copper films deposited at room temperature by this method contained carbon and the resultant electrical resistivity was approx. 5 $\mu\Omega.cm$ which was substantially higher than that of pure copper (~1.8 μΩ.cm). Lakshmanan et al., described a plasma assisted CVD process, to deposit low resistivity (~2.2 μΩ.cm) copper thin films by employing $Cu(hfac)_2$ [copper hexa-fluoro-acetylacetonate] in combination with hydrogen plasma below 190° C., in Journal of Electrochemical Society vol. 145, p. 694-700, February 1998. It was observed that purity of copper thin films was strongly dependent on the process pressure which affected H atom concentration in the gas phase and also process temperature that affected surface H atom concentration necessary to remove organic hfac group from the surface responsible for undesirable C, F and H impurities inclusion responsible for higher electrical resistivity of copper films. It is, however, noteworthy that at higher plasma power high-energy electrons and ions led to the decomposition of the copper precursor $[Cu(hfac)_2]$ in the gas phase. This resulted in to high resistivity copper films, most probably due to inclusion of elements or fractions containing fluorine, carbon and/or oxygen. Such a possibility can very well limit the envelope and scope of a plasma enhanced copper deposition process. Martensson et al., in the Journal of Electrochemical Society, vol. 145, p. 2926-2931, August 1998 described a low temperature (<250° C.) thermal atomic layer deposition process employing $Cu(thd)_2$ [Cu(II)-2,2,6,6-trimethyl-3,5-heptanedionate] as a copper precursor with molecular hydrogen on a metal catalyzed substrate. The films deposited by this thermal ALD process were of high purity and also highly crystalline. The copper precursor $[Cu(thd)_2]$ employed in this process, however, is a low volatility solid with a significantly large molecular size which may hinder surface coverage of the substrate in an ALD process. Solanki et al., in the Electrochemical and Solid State Letters, vol. 3, No. 10, p. 479-480, 2000; described a copper ALD process employing $Cu(hfac)_2$, X $H_2O$ [copper hexa-fluoro-acetylacetonate hydrate] with methanol, ethanol and formalin (37% formaldehyde) as reducing agents at 300° C. The resultant copper films showed excellent resistivity (~1.78 μΩ.cm) at a thickness above 1200 Å. Soininen et al., in the U.S. Pat. No. 6,482,740 disclosed the deposition of metallic copper for interconnects in vias and trenches by reduction of copper oxide by various organic reagents such as alcohols, aldehydes and carboxylic acids. Both copper deposition processes described above employ aqueous solutions of these chemical reagents, which makes copper susceptible to oxidation. The aqueous process is also susceptible to difficulties encountered to transport viscous liquids into narrow sub-micron device features, which would tend to narrow further increase further with advancing device generations.

Kew-Chan Shim et al., described the results of a novel process of surface catalyzed deposition of copper in sub-micron features in the Journal of Electrochemical Society, volume 149, No. 2, page G109-G113, February 2002. The copper chemical precursor was hexafluoroacetylacetonate copper(1) trimethylvinylsilane [Cu(hfac)TMVS], which was combined with iodine, added by exposing the substrate to ethyl iodide $[C_2H_5I]$ vapor prior to copper deposition, adsorbed on to the substrate surface. The substrate was silicon coated with 1.0 micron $SiO_2$ on to which 45 nm thick layer of TaN and a 30 nm seed-layer of copper was sputter deposited. Copper deposition process temperature was 150° C. The process could fill the sub-micron trench (0.3 micron wide and 1.0 micron deep). The film growth and gap fill was a three step mechanism—in the first step conformal film of copper was deposited. In the second step the bottom of the trench was filled up and in the third step copper film grew laterally on the top surface of the substrate. Such a process, however, requires a base copper seed layer film to be deposited to initiate the copper deposition process. Moreover, this method of copper gap-fill does result into finite amount of copper deposition on the flat surface of the substrate which necessitates application of Chemical Mechanical Polishing (CMP) process to remove this and underlying copper diffusion barrier layer. The CMP process is beset with a variety of serious issues such as dishing, erosion etc. which are described by Wrschka et al., in the Journal of Electrochemical Society, volume 147, p. 706-712, February 2000.

Recently, Lim et al., in Nature Materials, vol. 2, pp. 749-754 November 2003, described self-limiting atomic layer deposition of several transition metals by thermal decomposition of N,N'-dialkylacetamidinato metal complexes of copper and cobalt, among other transition metals, in molecular hydrogen ($H_2$) gas. Alkyl group in the copper metalorganic complex was isopropyl ($i-C_3H_7$). The resultant copper complex was a dimeric solid [melting point=170° C., vapor pressure=0.05 Torr at 70° C.] which reacted with $H_2$ gas at 280° C., to deposit conformal copper films in a 10:1 aspect ratio feature. Apart from low volatility and potentially high cost and complexity of the copper chemical precursor molecule, the copper ALD process described above operates at higher temperature for the tolerance of delicate low-k dielectric materials.

ALD process of by reduction of cuprous chloride (CuCl) by molecular $H_2$ between the temperatures of 300-350° C. was published by Martensson et al. in Chemical Vapor Deposition, volume 3, No. 1, p. 45-50 (1997). CuCl is a low volatility solid [m. p. ~350° C.], however, it is a simple precursor molecule that is rather inexpensive in comparison with a variety of organometallic precursors evaluated so far. Also, it is a highly desirable precursor due to its straightforward and potentially clean reduction to metallic copper with hydrogen through hydrochloric acid (HCl) gas as a by-product and has significant potential to deposit high purity copper films. Moreover, its reaction with atomic hydrogen can potentially reduce the ALD reaction temperature significantly. However, being a low volatility solid, its large area distribution needs to be satisfactorily solved. In addition to this, atomic hydrogen tends to rapidly recombine on metal surfaces leading to its depletion in deep and narrow trenches. Thus in absence of an efficient mechanism to transport atomic hydrogen effectively and in sufficient quantities within etched features over the entire substrate surface, it would be difficult to realize an effective copper ALD process from CuCl and atomic hydrogen.

The copper chemical precursors employed in the copper deposition processes described above are low volatility and large organometallic molecules that are generally expensive. Moreover, their vapor phase dissociation, by application either of heat or plasma, is seldom clean and it tends to incorporate undesirable impurities such as carbon, fluorine and others that adversely affect the purity, resistivity and also adhesion of the resultant copper layer to the underlying diffusion barrier. In absence of a viable copper deposition process, the overall process sequence described above to obtain filled copper plugs lined with a diffusion barrier thus entails three different methods of processing namely: (a) physical vapor deposition or sputtering to deposit seed copper layer on top of the diffusion barrier layer (b) electrochemical copper deposition and (c) chemical-mechanical (or chemo-electro-mechanical) removal of copper. In a multilevel metallization structure each of these steps must be sequentially performed in a dedicated equipment once for each level of metallization. However the approach as outlined above has a number of serious pitfalls:

(a) Inadequate step coverage by sputtering of barrier in small vias and trenches: As the critical device dimensions reduce with each advancing device generation, the vias and trenches are becoming increasingly smaller from 0.13 to 0.10 micron and even below while aspect ratio is steadily increasing. Sputtering (PVD) being a line of sight process leads to inadequate deposition of thin film material on the side-walls of the dielectrics. As a result, conformality of barrier deposition by this method is becoming increasingly inadequate. This has led to significant and adverse impact on the quality of copper seed layer and subsequent copper gap fill process extending into the overall device quality.

(b) Poor conformality and discontinuity of copper seed layer by sputtering: Thin copper seed layer as sputtered on the underlying diffusion barrier also shows inadequate degree of conformal deposition and at times spatial discontinuity and non-uniformities over the contours and surfaces of the structures. However, any discontinuity in this layer has serious consequences for the next step of electrochemical copper deposition which requires a physically continuous copper layer. Thus reliability and quality of the device in terms of important functional parameters such as electromigration resistant can be seriously compromised if this step is not performed satisfactorily.

(c) Corrosion due to wet electrochemistry: This is a very serious issue that is under active investigation. The CMP or the other processes employed to remove copper such as dissolution of copper in acidic solutions, reverse anodic electro-dissolution of copper are fraught with corrosion of copper. This may be attributed to micro-quantities of trapped water within grains boundaries of copper. Copper is highly susceptible to oxidation when exposed to moist air at room temperature. Also, copper wiring in microcircuits during operation, as it conducts electricity, may heat up significantly. This may result in to undesirable scenarios: generation of high pressure localized steam that may lead to violent rupture of the interconnect structure or it may set up localized galvanic cells to initiate copper corrosion. Moreover, in-situ corrosion due photoelectrons has been an added issue. All these factors have a significant and adverse impact on the yield, reliability and overall stability of a copper metallization interconnect scheme being practiced currently.

(d) Dishing and erosion in CMP: During CMP the wafer surface is polished by rotating and pressing it against a flexible pad on to which an aqueous slurry containing a chemically active agent (chlorides of iron etc.) and an abrasive powder (such as ceria—$CeO_2$) is spread. The copper layer to be polished is removed under a combined action of chemical reaction and mechanical force. The surface being polished usually results in to a dish shape within the feature with the material at the center of a feature being polished more as compared to the edge. Dishing is more pronounced in larger dimension features as compared to narrow features. Moreover, end point detection of the process is a complicated task which in practice leads to erosion and over polishing. Further to this, CMP may lead to micro-scratches, embedded undesirable solids and corrosive material residue on the surface. A thorough and proper clean with a deionized water is a highly essential to mitigate these issues.

(e) Defects in copper by CMP and electrochemistry: Various sources of defect generation in copper such as pin-holes, craters and volcanoes are associated with wet processes and CMP that impart adverse effects on the microstructure and overall quality of copper being laid down in the microcircuits.

(f) Process Waste Remediation: All the wet processes (CMP, Electrochemical Deposition, Copper Dissolution) in copper metallization use highly pure and deionized water in large quantities. Deionized water must be continuously supplied in large quantities and it must be treated properly to conform to the local, existing environmental regulations before it is discharged in to effluent stream. Moreover, large quantities of used chemical slurry must be contained and its remediation must be carried out according to guidelines. This adds to the expenses and can be a substantial part of the final cost and operation.

(g) Cost of multiple tools and spare hardware and process consumables: The metallization scheme, as outlined above, has three distinct process steps that require a separate process module each. It thus entails substantial operating costs to the owner per tool in terms of expensive fab floor space, tool operation, maintenance, and process chemical consumption and also cost of each tool maintenance and process consumables. All these factors add to the cost-of-ownership significantly.

In summary, the existing multiple process equipment and their operation suffer from various drawbacks and issues that adversely impinge on the cost, reliability and device yield. Moreover, the current equipment as described above, may not be easily extendible for the upcoming smaller device dimensions. Thus, there is a clear and urgent need for vapor phase processes for deposition, gap fill and top layer removal and related equipment to provide the following:

Perfectly conformal step coverage and process for the diffusion barrier layer,

Seamless and high speed copper/conductor vapor phase deposition process to completely fill vias and trenches (the contacts) without void, key-hole, seam or other defects with excellent adhesion and electro-migration resistance, High speed vapor phase removal process for the excess top layer of copper/conductor material deposited during the gap fill, Precision and vapor phase removal of the diffusion barrier process to expose the underlying dielectric layer, Extendibility of the process and equipment for processing of increasingly larger diameter wafers with continuously decreasing device dimensions below 0.10 micron, Improved uniformity and excellent thickness control across the wafer with high degree of process stability and repeatability A method of filling a gap structure in an electronic device, employing vapor phase chemistries, was disclosed in the U.S. Pat. No. 6,635,965 wherein the inventors supplied the reactive gases alternately in a pulse mode to the substrate with features, placed on a first station in a multi-substrate processing chamber, to obtain near perfect step coverage of the feature. During the pulse deposition process one or more monolayers may be deposited on the etched feature. Subsequently, the substrate was transferred to the high-rate Chemical Vapor Deposition (CVD) station to fill the gap structure completely. In the U.S. Pat. No. 6,551,929; a method of forming gap-filled structures on a substrate involving two separate process chambers was disclosed. In this gap-structure filling method a patterned substrate, was exposed to alternating flows of reactive gases in the first processing chamber to form a nucleating layer. Next the substrate was transferred to the second processing chamber wherein the patterned gap-structures were filled by employing a high-rate CVD process. In both the inventions described above, two distinct substrate processing reactors were required to completely fill the gap structure on the substrate wafer.

Lopatin et al., in the U.S. Pat. No. 6,368,954 described the application of ALD in the fabrication process of copper interconnects. In this invention, a pre-seed layer and a thicker seed layer, both of copper, follow deposition of the diffusion barrier layer. The inventors described the process of formation of diffusion barrier layer and subsequent copper seed layer, both by ALD processes in the same reactor. The inventors also recommend that reactor be purged with $N_2$ between two ALD processes for almost 15 minutes to an hour. The chemical composition of diffusion barrier and copper are substantially different and to avoid cross contamination, it is highly advisable to perform respective chemical processes for different thin film materials in dedicated reactors. Also, long durations of dry nitrogen purge can slow the overall process sequence and make it uneconomical. The invention states a two step copper deposition process—pre seed layer and seed layer. The inventors also state that the copper seed layer can be substantially thicker than the barrier layer and for very narrow trenches it may serve to form the interconnect itself and no further electrolytic deposition may be needed. However, this approach of interconnect fabrication can be practical only in case of extremely narrow features where the rate of deposition of existing ALD processes is sufficient to offer economical throughput. The current ALD equipment, however, is woefully inadequate to process thicker films. Furthermore, electrochemical deposition (ECD) to fill the etched vias and trenches with copper and CMP to remove the excess copper and diffusion barrier on the top surface are both necessary.

Nguyen et al., in the U.S. Pat. No. 6,284,052 described removal of a copper layer deposited on the internal reactor surfaces such as heated wafer chuck, by oxidizing it first with oxygen plasma and then reacting it in-situ with a liquid chelating agent such as 1,1,1,5,5,5-Hexafluoro-2,4 pentanedione ($H^+$ hfac) to form a volatile solid compound copper (II)(hfac)$_2$ that is removed from the reactor under the action of vacuum and elevated temperature. In the chamber clean process employed herein, active oxygen plasma is used to fully oxidize deposited metallic copper in to copper oxide which limits the nature of the process sequence to a two step process because the chelating agent, which is usually an organometallic compound, and the oxygen plasma cannot be simultaneously present in the chamber to prevent its decomposition. Moreover, the process chemistry is limited to copper oxide only. The process of removal of deposited copper on the internal surfaces of the chamber is carried out only when the substrate wafer is removed from within the process chamber.

Andricacos in the Electrochemical Society Interface, p. 32-37, Spring 1999 issue described filling of sub-micron features for damascene metallization in by copper electroplating through three distinct processes, described in detail later, such as: (a) anti-conformal (b) conformal and (c) super-filling. An anti-conformal filling process with a non-uniform deposition on the side walls invariably led to a void in the center of the feature whereas a perfectly conformal filling process with uniform deposition on the side walls and also the bottom of the feature resulted into a seam at the middle which is an undesirable defect and thus cannot be satisfactorily employed for the gap-fill purpose. However, gap-fill through a super-filling process only, in which a higher amount of film is deposited at the bottom of the feature as compared to the side-walls, led to complete and defect free filling of the gap-structure found to be the most desirable process. Thus a conformal and an anti-conformal filling of a sub-micron feature were both shown to be highly defect-prone. Also, during an etch back process, employed for removal of excess deposition on the top surface, a defective filling of the feature can either begin to open up rapidly or be filled with the reactive fluids employed in the excess material removal process thus leading to full destruction of a highly critical void-free gap-filled structure required for high quality device fabrication.

In view of stringent processing demands and considerable difficulties being encountered listed above, atomic layer chemical vapor deposition (or ALD) with its extremely precise process control is the most suitable technique that can be employed effectively to obtain a desired solution. ALD is a simple variant of the industry prevalent technique of Chemical Vapor Deposition. ALD was invented in Finland in late 70s to deposit thin and uniform films of compound semiconductors such as Zinc Sulfide as described in the U.S. Pat. No. 4,058,430 by Suntola et al. There are several attributes of ALD that make it an extremely attractive and highly desirable technique for its application to the microelectronic device fabrication industry. ALD is a flux independent technique based on the well-known principle of monolayer formation by chemisorption, which is inherently self-limiting. ALD process is also relatively temperature uniformity insensitive. In a typical ALD sequence two highly reactive gases are injected sequentially on the substrate interspersed by an inert gas to sweep away excess reactants. A monolayer of the solid film is formed in each cycle and reaction by-products are swept away. The desired film is thickness is built by simply repeating the complete reaction sequence. The most desirable attribute of ALD is its ability to offer atomically uniform, perfectly conformal and area independent thin film coatings in high aspect ratio deep sub-micron geometries. With continuously decreasing device dimensions, such features in ALD make the application of ALD highly suitable and desirable for upcoming device generations and for larger diameter wafers. An excellent description of the fundamentals and applications of ALD and the progress it has made so far is offered in a review article written by T. Suntola titled Atomic Layer Epitaxy in the Handbook of Thin Film Process Technology, Part B 1.5, p. 1-17, IOP Publishing Limited, 1995, which is included herein as a reference.

In a typical ALD process, however, the rate of deposition is fixed and it is solely dependent upon the speed of completion of a single ALD sequence, which is generally 1 to 2 Å/cycle depending upon the thickness of the monolayer. For ALD to become acceptable to the microelectronic device fabrication industry it must offer competitive throughput. Hence, it is imperative to complete one ALD sequence comprising of four gas pulses in as short time as possible. Also, with the introduction of temperature sensitive low-k dielectric materials, higher process temperatures have become unacceptable. This has led to development of radical assisted ALD processes and reactor design as described in the U.S. Pat. No. 6,342,277 and plasma assisted ALD process and reactor design in the U.S. Pat. No. 6,416,822.

The ALD process, however, is significantly slower as compared to a CVD process that can operate at a rate of several hundreds of Ångstrom/minute. Such an operational handicap can very well lead to restricting application of ALD to only a few tens of Å thin films e.g., diffusion barriers or gate dielectrics. An ALD reactor that can operate as a high-rate CVD reactor is thus necessary to achieve desired process simplification. As an example, a flexible high-speed Atomic Layer Processing reactor which can also be operated as a high rate chemical vapor deposition reactor is described in detail in the U.S. Pat. No. 6,812,157. Its plasma enhanced variant configuration and associated Plasma Enhanced Monolayer (PEM) processes are described in the U.S. patent application Ser. No. 10/865,111 and apparatus and methods for in-situ chemical precursor generation for vapor phase processes as described in the U.S. patent application Ser. No. 10/975,169; which are relevant to the present invention and are included herein by way of reference.

It is thus apparent to an individual skilled in the art that a flexible and high-speed atomic layer processing reactor employed to facilitate processing of various thin films is a generic one in nature and is thus not limited by the reaction chemistry of deposition or etching or surface modification of any desired film material. Therefore, a high-speed and flexible ALD reactor has a secondary purpose to process, using one or more embodiments described herein, a variety of thin films of metals, semiconductors and insulators and suitable combinations thereof with atomic level precision on a substrate under suitable process conditions. To an individual skilled in the art, the objectives and advantages of the present invention will soon become apparent from the summary, detail description of the invention and specific embodiments described herein. It should be understood, however, that the detail description of the invention and specific embodiments are given by way of illustration only, since various modifications and combinations of specific features of one or more embodiments are well within the scope and spirit of the present invention. In summary, the foregoing description indicates that there is a clear and urgent need to devise a scheme that will simplify gap-filling process sequence, improve the quality of thin films and reduce process complexity and enhance the device yield while critical device dimensions are continuously reduced.

SUMMARY OF THE INVENTION

In order to achieve high quality, low-cost and high-yield multilevel metallization scheme, all vapor phase processes capable of: deposition of high quality, pin-hole free and conformal copper diffusion barrier and an excellent, defect-free copper gap-filling in addition to a high-speed, high-precision excess copper and also copper diffusion barrier removal are highly essential. To achieve this, it is highly desirable to employ a flexible atomic layer chemical vapor processing reactor that can modulate the process mode from discrete flow (sequential pulsing) atomic layer to continuous flow high-rate chemical vapor phase processes in-situ in order to accelerate or tailor the processing speed, if required, to process larger dimension structures. Moreover, such a flexible atomic layer vapor processing reactor has capabilities to incorporate plasma to help process thin films at lower temperatures and also to selectively attract charged reactive species towards the substrate surface and thereby modulate the contours of the film being deposited within the etched gap structures or a recess.

In accordance with the above stated features and capabilities of the flexible atomic layer processing reactor design, one of the purposes of the present invention is to exploit the capabilities of a flexible atomic layer processing reactor to develop a variety of chemical vapor processes for deposition, isotropic removal and also surface modification. Thus within the ambit of this invention are processes of deposition, isotropic etching and surface modification (to change the chemical nature of the substrate surface) that are performed either in a pulsed flow mode or in a continuous flow (high-rate) mode. Moreover, the activation energy for the reaction is supplied either by thermal means alone or it is complemented by plasma. The combination of such capabilities allow the practitioner to develop a variety of vapor phase chemistries to tailor to the device dimensions to be processed. The applicable vapor phase processes for this invention are: discrete flow (sequential pulsing or pulsed flow) plasma assisted vapor phase processes such as Plasma Enhanced Monolayer deposition, Plasma Enhanced Monolayer Removal and Plasma Enhanced Monolayer Surface Modification, together defined as "PEM Processes" and also their continuous flow counterparts such as: PECVD, Plasma Enhanced Isotropic Etching and Plasma Enhanced Surface Modification—in general termed Plasma Enhanced Chemical Vapor Processes or "PECV Processes" that are applicable for processing larger dimension gap structures. Also within the scope of this invention are thermally driven counterparts of the above mentioned processes such as ALD, Atomic Layer Removal and Atomic Layer Surface Modification together defined as "Atomic Layer Processes—ALP", and also their continuous flow counterparts such as CVD, Chemical Vapor Removal and Chemical Vapor Surface Modification—together defined as "Chemical Vapor Processes—CVP". Thus for the purpose of this invention, a substrate wafer processing reactor that can perform one or more processes selected from the group comprising PEM, PECV, ALP and CVP; is termed Plasma Enhanced Monolayer (PEM) processing reactor. One or more of these processes is employed to modulate the rate of thin film processing and also the contours of the film being deposited.

The present invention describes the process sequence starting with a copper diffusion barrier deposition, on an etched surface of a dielectric layer with gap structures formed in it. A highly conformal coating of the diffusion barrier layer of controlled thickness is deposited by process of atomic layer deposition in the first substrate wafer-processing reactor. Such a reactor may operate in a PEM deposition or an ALD mode.

In the next step, the substrate wafer is removed from the first substrate processing reactor and placed in a second substrate wafer processing reactor to deposit copper film by employing a suitable combination of either PEM deposition or a continuous flow PECVD of copper. In a PEM deposition process, depending upon process parameters such as operating pressure, process chemistry and substrate bias, copper film of larger thickness is deposited on the bottom surface of the gap structure as compared to its vertical sidewalls. The relative rates of deposition on the bottom of the gap structure and on the sidewalls and hence the slope of the copper film surface being deposited within the gap structure is controlled and modulated by continuously modulating the relevant process parameters. By continuing the process further gap structure is thus filled with copper completely. It should be noted here that the second substrate wafer processing reactor is so designed as to modulate the processing rate over a wide range of process parameters such as the nature and flow rates of chemical precursors, respective gas flow pulse widths, operating pressure, substrate temperature and also more importantly the substrate bias. Moreover, the second substrate processing reactor can also operate in a high rate PECVD mode desirable for processing of larger dimension gap structures. During the filling of an etched feature, thin film of copper is also deposited on the top surface of the substrate.

In the next step, the second substrate wafer processing reactor, in which copper film was deposited, is purged completely. The planar copper film on the top surface of the substrate is etched in-situ (without removing the substrate wafer from the second substrate processing reactor) in a substantially isotropic manner, by employing suitable vapor phase chemistries and adjusting the process parameters such as pressure, substrate temperature, precursor flow rates and pulse widths, thus leaving behind a flat surface of the substrate wafer with vertically filled solid metal plugs and an underlying diffusion barrier layer being exposed. In order to accelerate the rate of planar copper removal reaction, temperature of the substrate wafer and the internal surfaces of the substrate processing reactor, exposed to the substrate wafer, is adjusted to a suitable level. Copper etching is a two step process. In the first step, the top copper surface is chemically converted in to an intermediate state such as oxide or halide of copper by employing a suitable reactive chemical reagent containing halogen or oxygen. In the next step, the as chemically converted copper surface is reacted with a chelating agent, which is transported in to the reactor in vapor phase, to generate a volatile copper chelate. The volatile copper chelate is then removed from the vicinity of the substrate surface under the combined action of temperature and vacuum. Optionally, the copper film can be etched away by forming a volatile copper halide. Also, the copper removal process can also be operated in a continuous flow regime to achieve high rate of copper removal in order to economically process larger dimensions features. Also, the second substrate wafer processing reactor may employ a reactive plasma in one or more copper removal steps. The in-situ copper removal process also results in to simultaneous cleaning of undesired deposition of copper on the inner surfaces of the deposition reactor. As a result, the second substrate processing reactor continually operates in a quasi-clean state for the next substrate wafer to be processed.

Subsequent to complete removal of copper layer on the flat surface, the substrate wafer is transferred to the first substrate wafer processing reactor and the reactor is completely purged and evacuated. Next, a suitable vapor-phase isotropic barrier etching chemistry aided by a plasma is employed in discrete flow mode to remove the remaining exposed barrier on the top substrate surface. The reaction products of the chemical reaction of diffusion barrier removal are volatile compounds of the constituents of the diffusion barrier layer, which are removed under the combined action of temperature and/or vacuum from the vicinity of the substrate. Since the isotropic diffusion barrier removal process removes the same amount of diffusion barrier thickness as it was deposited in the first step of the barrier deposition process, it also helps run the first substrate wafer processing reactor in a quasi-clean state.

Finally, the substrate wafer is transferred to a third substrate wafer processing reactor for surface modification of the exposed dielectric surface and the exposed copper plug surface, both of which are subjected to reactive chemistries during diffusion barrier removal. In the third substrate wafer processing reactor, the substrate wafer is treated with a neutralizing plasma e.g., hydrogen plasma in order to convert the top surface of the metal plugs in to zero valence state. Alternatively, it is exposed to the chelating chemistry to remove chemically converted copper (oxidized or halogenated copper) on the surface.

The end point for copper and diffusion barrier removal processes described above can be suitably detected by simply relying on the ratio of the blanket copper film surface area to the sum of copper plug surface area (top of gap structures) and the fact that the magnitude of the signal used by a detection instrument is proportional to the exposed area. For example, in the copper removal process, the blanket copper film surface area is substantially larger than the sum total of the copper plug surface area. As the final blanket copper layer on the top surface of the substrate is removed, only a small fraction of the copper surface is exposed and the signal intensity sharply drops. This principle to detect an end-of-process (EOP), which is routinely employed in the microelectronic device fabrication industry, however, offers a highly reliable and simple method of detection of the quantity of the material remaining on the substrate wafer surface. A downstream residual gas analyzer, as an example of end point detection instrument, may be suitably employed to detect the quantity of volatile copper compound in vapor phase as function of time. Alternately, an optical sensor (as used in absorption spectroscopy) attached to the reactor walls in the substrate plane or placed downstream and tuned to a specific emission wavelength of the product chemical species of the copper etching reaction in vapor phase may also be suitably employed to detect the end-of-process precisely.

The overall process sequence employs dedicated wafer processing reactors to perform only one type of process chemistry, e.g. either copper processing, diffusion barrier processing and surface modification to maintain the purity of the internal environment within each reactor and to minimize any cross contamination of elements from one layer in to the other. Also, such approach can become effective by multiple reactors being clustered around a single automated substrate handler for efficient process sequence integration and execution. Moreover, one or more reactors in the cluster can be a batch processor to balance and enhance the overall process throughput. Finally, wherein a particular process time, e.g. copper deposition and removal, within the overall process sequence is substantially longer than the other processes, multiple and identical reactors for that particular process chemistry are employed in a cluster to avoid a bottleneck or backlog to balance wafer sequencing and achieve the maximum throughput.

DETAILED DESCRIPTION OF INVENTION

Figure 1:
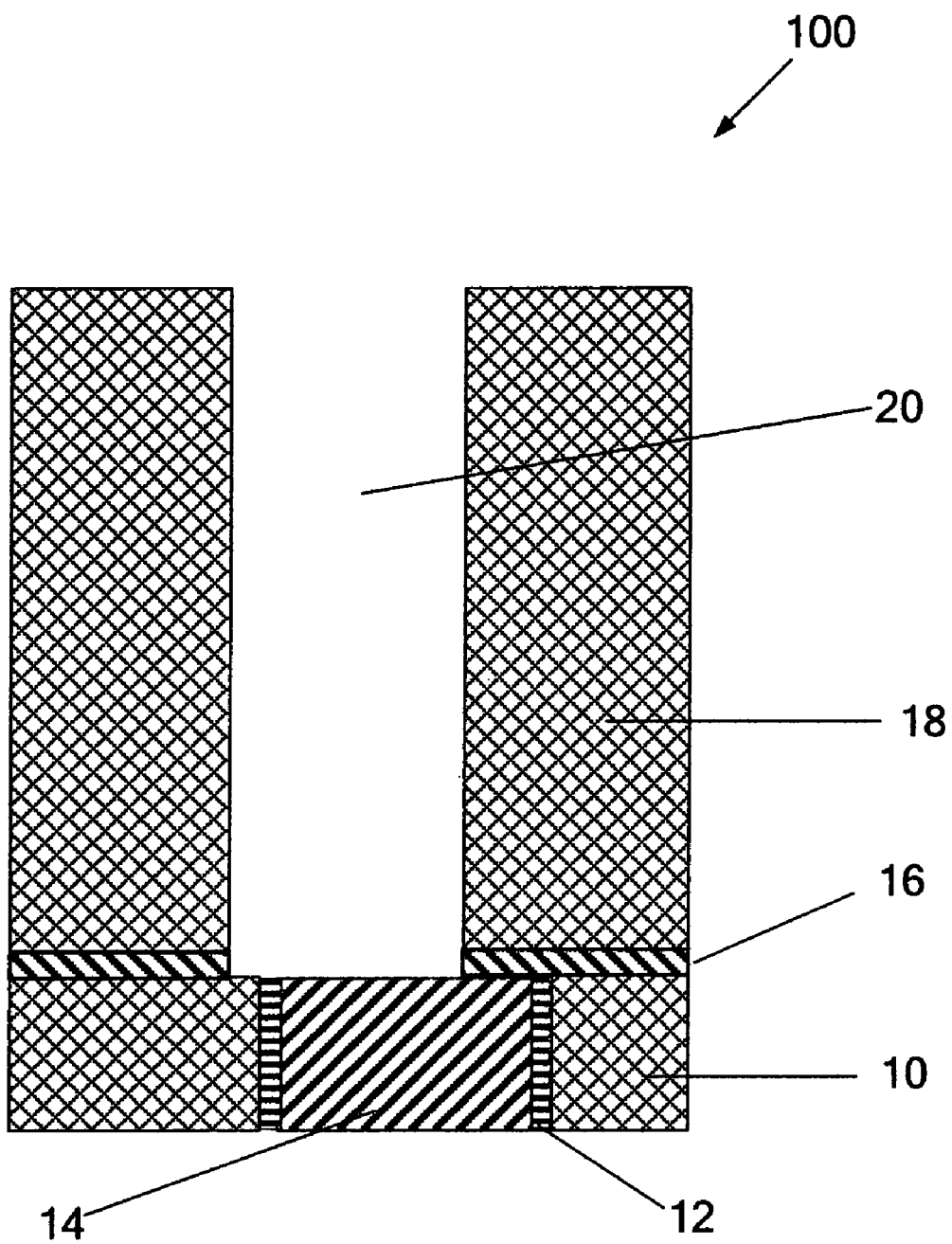
FIG. 1 illustrates the magnified cross section view of the top portion of a substrate wafer, with part of the dielectric layer etched to form a trench, prepared for copper diffusion barrier deposition in the multilevel metallization scheme according the prior art.

The invention is explained in further detail with the help of figures each associated with its detail description. A magnified view of the cross section of the top portion of the substrate wafer with an etched trench structure 100 is shown in FIG. 1. The trench pattern 100 consists of a previous dielectric layer 10, e.g. $SiO_xC_y$, a diffusion barrier layer 12 for example TaN, a previous metallization layer 14 for example copper, an etch stop layer 16, e.g. $SiN_x$ or SiC, a trench dielectric layer 18, e.g. $SiO_xC_y$, and an open trench gap 20. To an individual skilled in the art, the single and double damascene structures and their fabrication process in multi-level copper metallization scheme are well known. The previous level of interconnect structure formed below the top damascene structure consists of a dielectric layer 10; a diffusion barrier layer 12 and the metallization layer 14 all can be formed by the same processes disclosed in this invention. It is essential to note herein that although that the present invention is, for the sake of simplicity only, described with reference to a single damascene structure it is equally applicable to a dual damascene structure.

Figure 2:
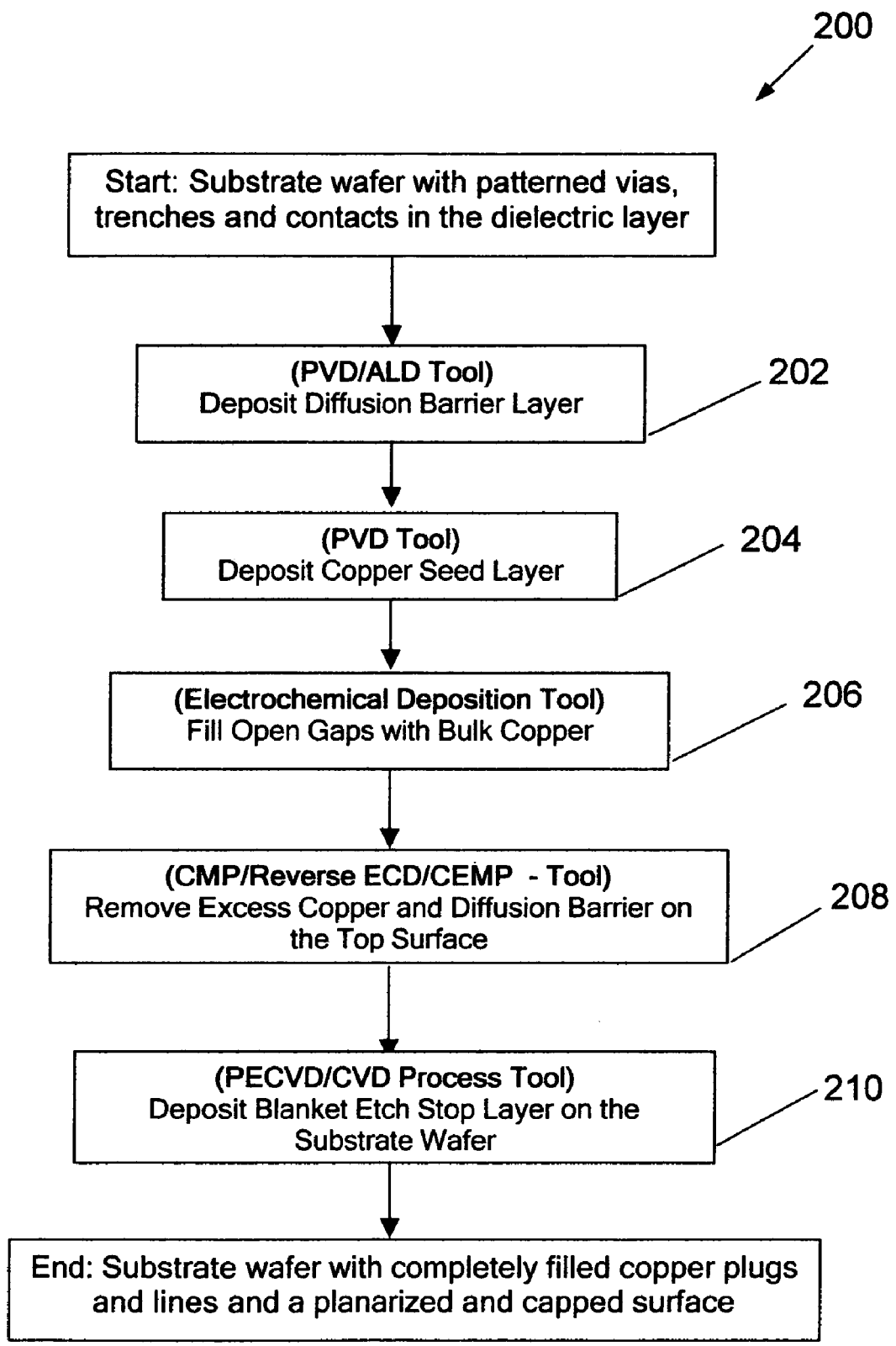
FIG. 2 shows the sequence of processes and equipment required to form one layer of copper metallization interconnect structures on the substrate wafer as practiced in the industry.

FIG. 2 describes the process sequence 200 as practiced in the industry currently to fabricate a damascene metallization structure. The process sequence starts with the substrate wafer with a trench structure 100 etched on it. In step 202, the substrate wafer is transferred in to the physical vapor deposition tool to deposit thin copper diffusion barrier layer e.g. TaN on the surface of the dielectric layer. Nominal thickness of the barrier layer is approximately 50-100 Å (5-10 nm). Next, in step 204 the substrate wafer is transferred to another PVD reactor to deposit a thin layer of copper with a nominal thickness of approx. 100 Å (10 nm). Subsequently, in step 206, the substrate wafer is transferred to an electrochemical deposition (electroplating) tool to fill the trench gap 20 completely. Next, in step 208, the substrate wafer is transferred to a Chemical-Mechanical Polishing (CMP) tool to remove the excess copper deposited during step 206 and the top layer of the diffusion barrier deposited in step 202. In the end, in step 210, an etch stop or a protective cap layer is deposited by either chemical vapor deposition or plasma enhanced chemical vapor deposition process and the substrate wafer is sent out for further processing.

Figure 3A:
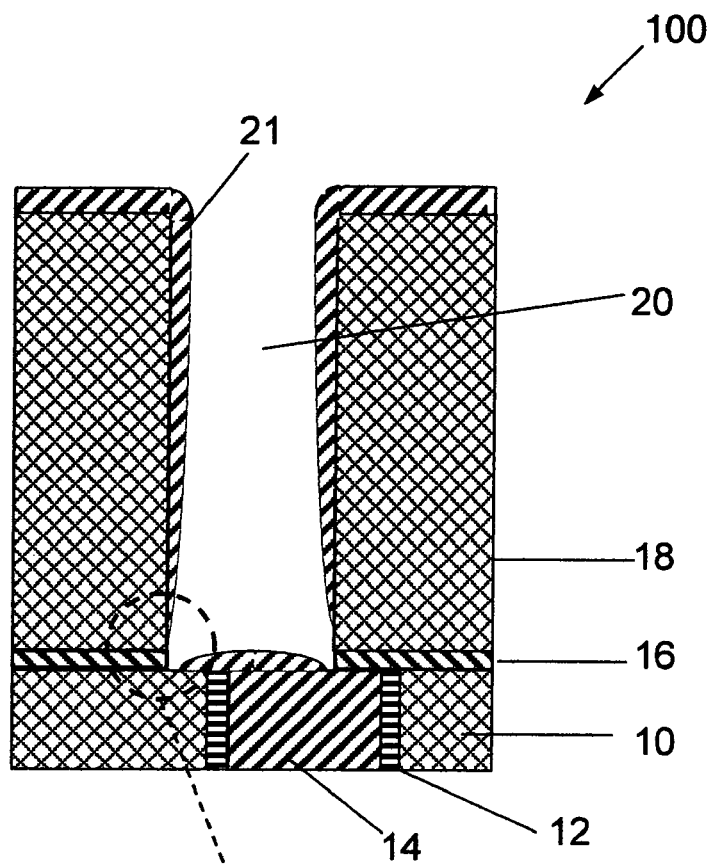
FIG. 3A illustrates the magnified cross section view of the top portion of the substrate wafer, with part of the dielectric layer etched to form a trench, after copper diffusion barrier deposition on the surface of the etched dielectric layer in accordance with the prior art.

FIG. 3A shows magnified view of the cross section of the etched trench structure 100, with the PVD copper diffusion barrier layer 21 on the inner surface of the trench gap 20. The film cross sectional view illustrates thickness non-uniformity along the vertical walls of the trench gap 20, typically observed in a PVD process.

Figure 3B:
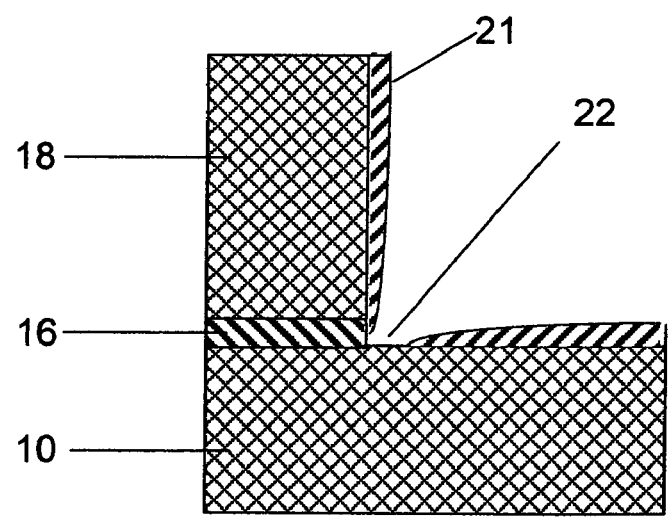
FIG. 3B illustrates the magnified cross section view of the top portion of a substrate wafer within the circle as shown in FIG. 3A.

FIG. 3B illustrates a further magnified view of a corner section of the trench gap 20 which clearly indicates highly uneven and non-uniform deposition of the copper diffusion barrier layer 21 on the inner surface of the trench gap 20 and an uncoated surface 22 in the vicinity of the corner, formed due to the prevalent deposition processes such as PVD or ionized sputtering, that is highly detrimental for the functioning of the device.

Figure 4A:
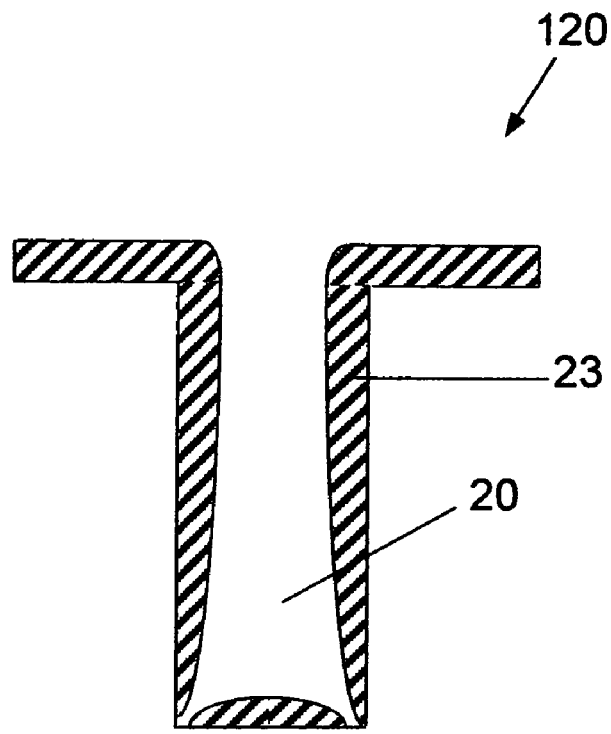
FIG. 4A shows the schematic cross sectional view of an electroplated copper layer in anti-conformal filling process in a trench in early stages of deposition according to the prior art.
Figure 4B:
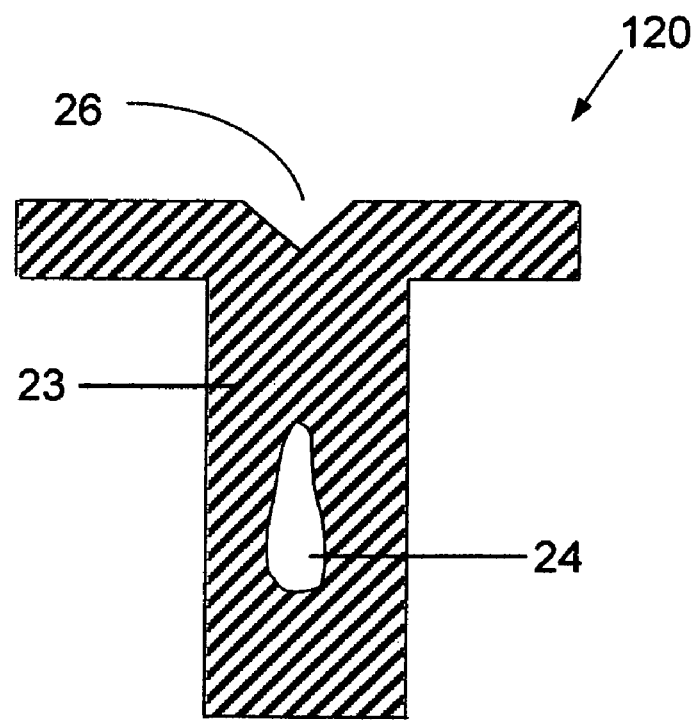
FIG. 4B illustrates the schematic cross sectional view of the resultant deposition of the electroplated copper in anti-conformal filling process in a trench according to the prior art.

FIG. 4A shows the schematic cross sectional view of a trench structure 120 with a trench gap 20 being filled by an electroplated copper layer 23 in anti-conformal filling process in the early stages of deposition according to the prior art. FIG. 4B illustrates the schematic cross sectional view of the resultant copper deposition in the trench gap 20 at the end of anti-conformal copper electroplating process. The anti-conformal electroplated copper layer 23 forms a void 24 within the trench gap 20 and a crater 26 at the top, both of which are highly detrimental for copper metallization.

Figure 5A:
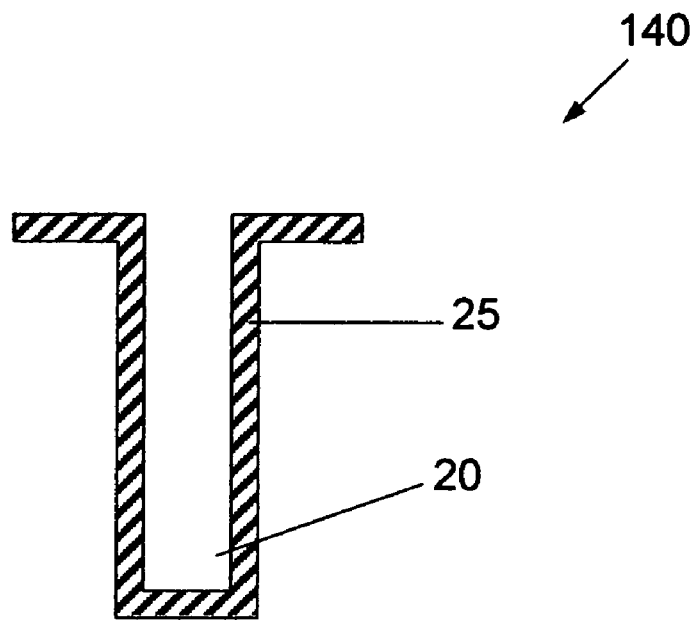
FIG. 5A shows the schematic cross sectional view of an electroplated copper layer in a conformal filling process in a trench in early stages of deposition according to the prior art.
Figure 5B:
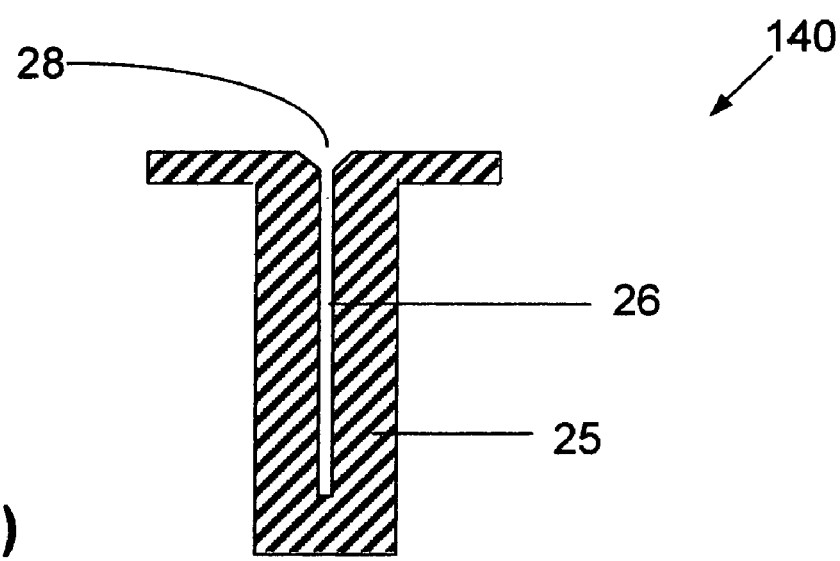
FIG. 5B illustrates the schematic cross sectional view of the resultant deposition of the electroplated copper in conformal filling process in a trench according to the prior art.

FIG. 5A illustrates the schematic cross sectional view of the trench structure 140 with a trench gap 20 being filled by an electroplated copper layer 25 in a conformal filling process. In a typical conformal filling process thickness of layer deposited on all surfaces of a structure is substantially the same. FIG. 5B shows the schematic cross sectional view of the resultant copper deposition in the trench gap 20 at the end of conformal copper electroplating process. The conformal electroplated copper layer 25 forms a vertical seam 26 at the center of the trench gap 20 and a trough 28 at the top, both which are undesirable and highly detrimental for device operation.

Figure 6A:
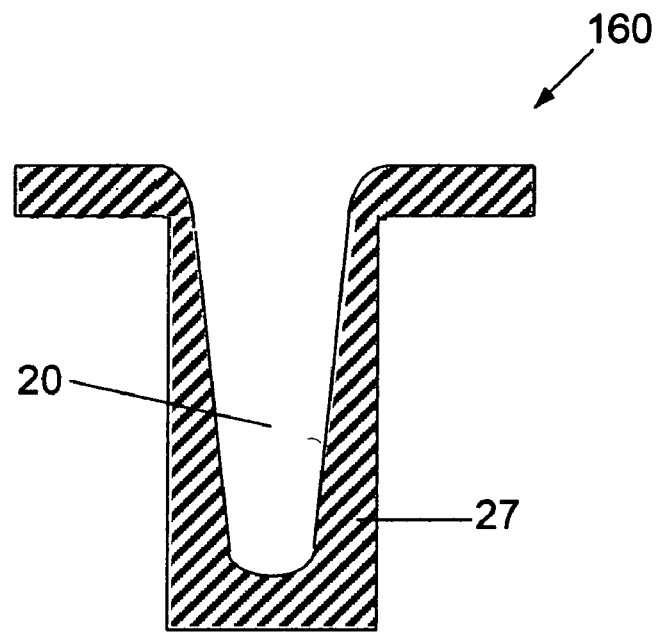
FIG. 6A shows the schematic cross sectional view of an electroplated copper layer in super-filling process in a trench in early stages of deposition according to the prior art.
Figure 6B:
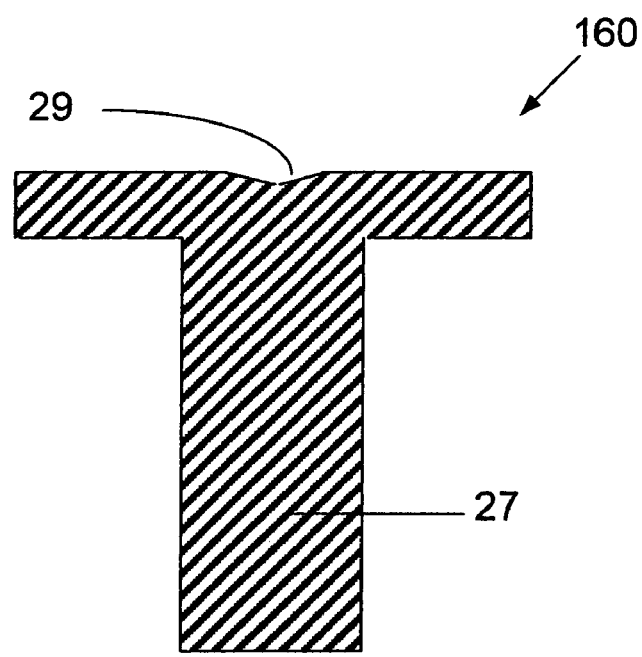
FIG. 6B illustrates the schematic cross sectional view of the resultant deposition of the electroplated copper in super-filling process in a trench according to the prior art.

FIG. 6A shows the schematic cross sectional view of the trench structure 160 with a trench gap 20 being filled by an electroplated copper layer 27 in a super-filling process. In a typical super-filling process rate of deposition at the bottom of the trench gap is higher than the rate of deposition at the vertical walls. Thickness of the super-filling copper layer 27 at the bottom of the gap 20 is thus significantly higher than the thickness of the super-filling copper layer on the vertical walls of the trench gap 20. FIG. 6B illustrates the schematic cross sectional view of the resultant copper deposition at the end of super-filling copper electroplating process. The super-filling electroplated copper layer 27 fills the trench gap 20 perfectly and completely without any seam and/or void, along with a much shallower trough 29 at the top. The super-filling process is the most desirable of the gap-fill processes for copper metallization.

Figure 7:
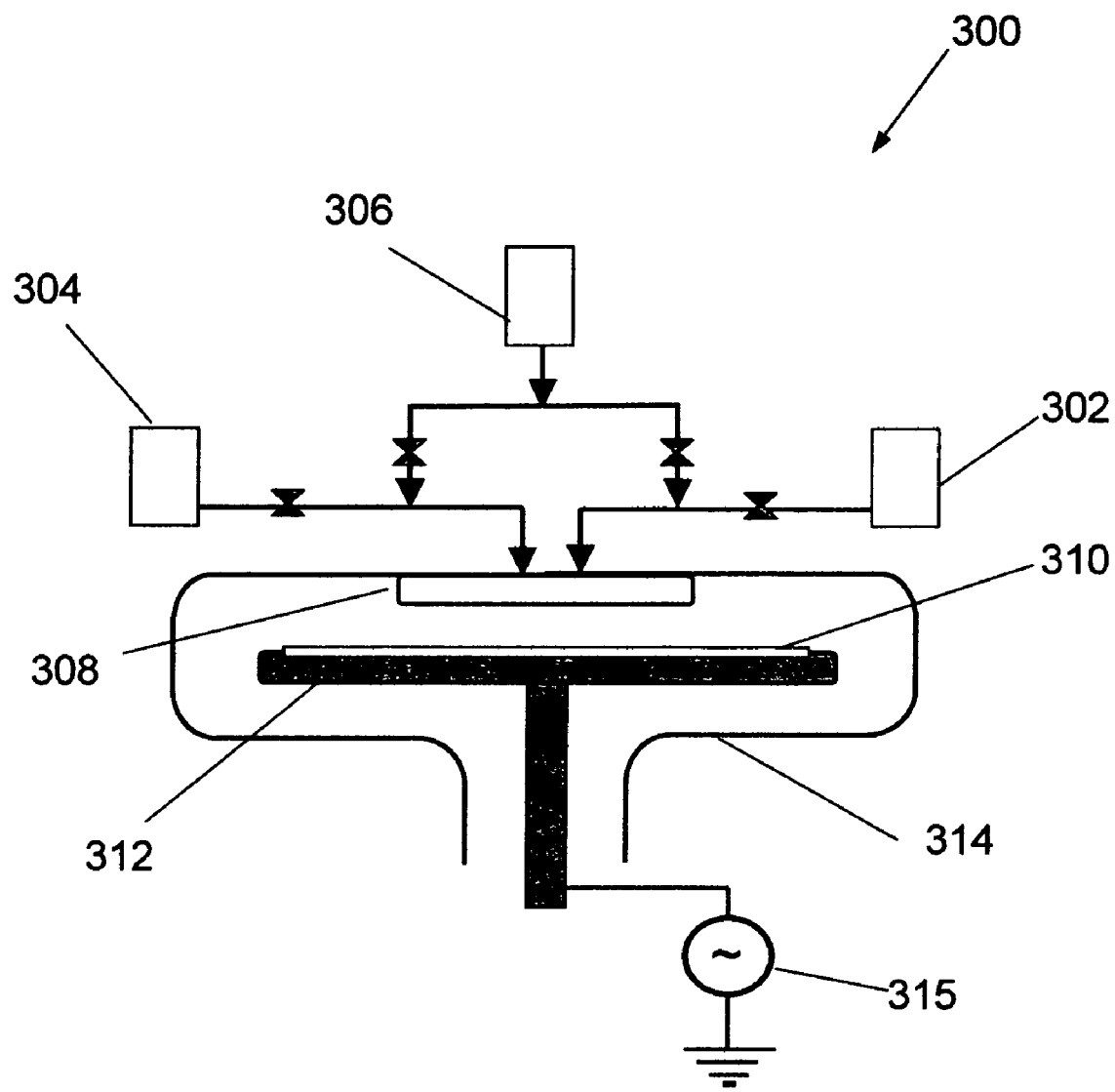
FIG. 7 illustrates the schematic cross section of the PEM reactor according to one embodiment of the present invention.

FIG. 7 shows schematic of an ALD reactor 300. It is supplied with two reactant supply sources 302 and 304 respectively and with an inert gas supply source 306 connected to the gas injection assembly 308 through a number of switching valves. The gas injection assembly employed to spread the reactive gases from sources 302 and 304 and the inert gas from source 306 on to the surface of the substrate wafer 310 that is mounted on to and is supported by the pedestal 312. The pedestal 312 is optionally connected to source of electromagnetic excitation energy 315 (e.g., RF power supply). The enclosure 314 provides the outer body for the ALD reactor assembly. The substrate wafer 310 is loaded and unloaded on to the pedestal 312 through a load/unload port that is provided within the outer body 314, which is not shown in the diagram. As an example, such an ALD reactor, which can also be operated in a PEM mode, is described in the U.S. patent application Ser. No. 10/865,111; which is included herein by reference.

Figure 8:
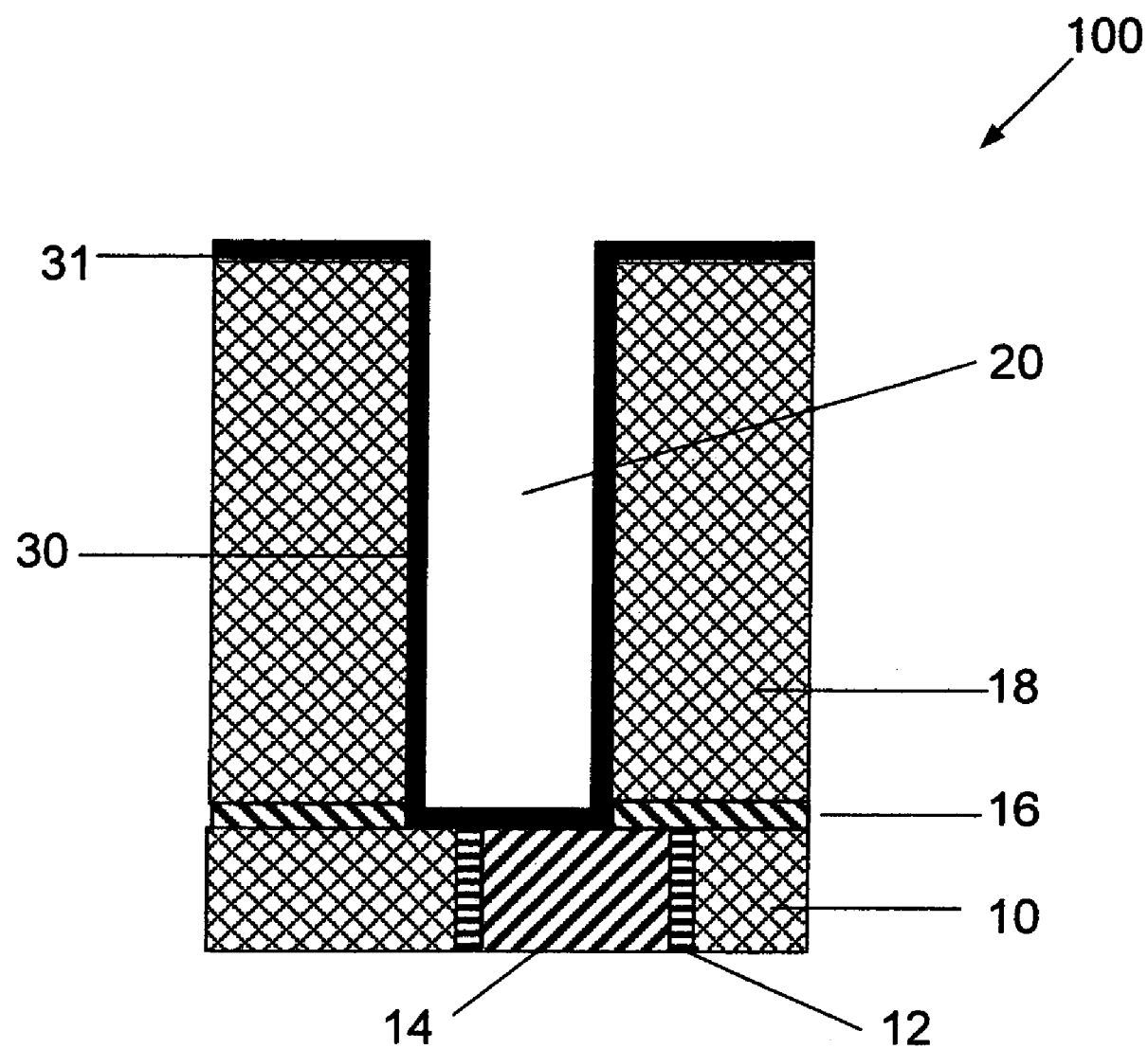
FIG. 8 shows the magnified cross section view of the top portion of a substrate wafer, with part of the dielectric layer etched to form a trench, after copper diffusion barrier deposition on the surface of the etched dielectric layer according to the atomic layer processes described in the present invention.

The process sequence of the present invention begins with a detail description of the FIG. 8, which shows the magnified view of the cross section of the substrate wafer with trench gap structure 100 already fabricated on its surface as the topmost layer. A highly conformal copper diffusion barrier layer 30 is deposited, by employing a suitable ALD process on the vertical walls and the bottom of the gap structure 20, that is highly uniform in thickness. The copper diffusion barrier as deposited on the top surface of the substrate wafer during the process of deposition of the barrier 30 is specifically referred to by numeral 31, the intention of which will soon be clear. The thickness and uniformity of the layers 30 and 31 is substantially same. The copper diffusion barrier layer 30 can be in the form of a combination of one or more of the following materials, but not limited to: titanium nitride (TiN), tantalum nitride (TaN), tantalum (Ta), tungsten nitride ($WN_x$), tungsten silicon nitride ($WSiN_x$), tungsten silicon nitride ($WSiN_x$), ruthenium (Ru) or ruthenium oxide ($RuO_2$). Thickness of the copper diffusion barrier ranges between 30-100 Å (3-12 nm) with a nominal thickness of about 50 Å (5 nm). ALD processes of deposition of a few representative thin film copper diffusion barrier materials (it should be noted herein that the processes described below are by way of example only and other processes employing alternative precursors and diffusion barrier materials are equally applicable) are summarized below:

$$TiCl_4 + NH_3 \rightarrow TiN + HCl \quad (1)$$

$$TaCl_5 + NH_3 \rightarrow TaN + HCl \quad (2)$$

$$WF_6 + NH_3 \rightarrow WN_x + HF \quad (3)$$

$$RuO_4 \rightarrow RuO_2 + O_2 \quad (4)$$

$$Ru(CO)_5 + O/O_2 \rightarrow RuO_2 + CO_2 \quad (5)$$

$$RuCl_5 + OH/H_2O \rightarrow RuO_2 + HCl \quad (6)$$

$$RuO_4/RuCl_5 + .H/H^+ \rightarrow Ru + H_2O/HCl \quad (7)$$

For sake of simplicity the equations of deposition reactions are not balanced. Also, .H denotes a hydrogen atom or free radical and hereafter, a radical of a chemical specie will be denoted by such a symbol.

Figure 9:
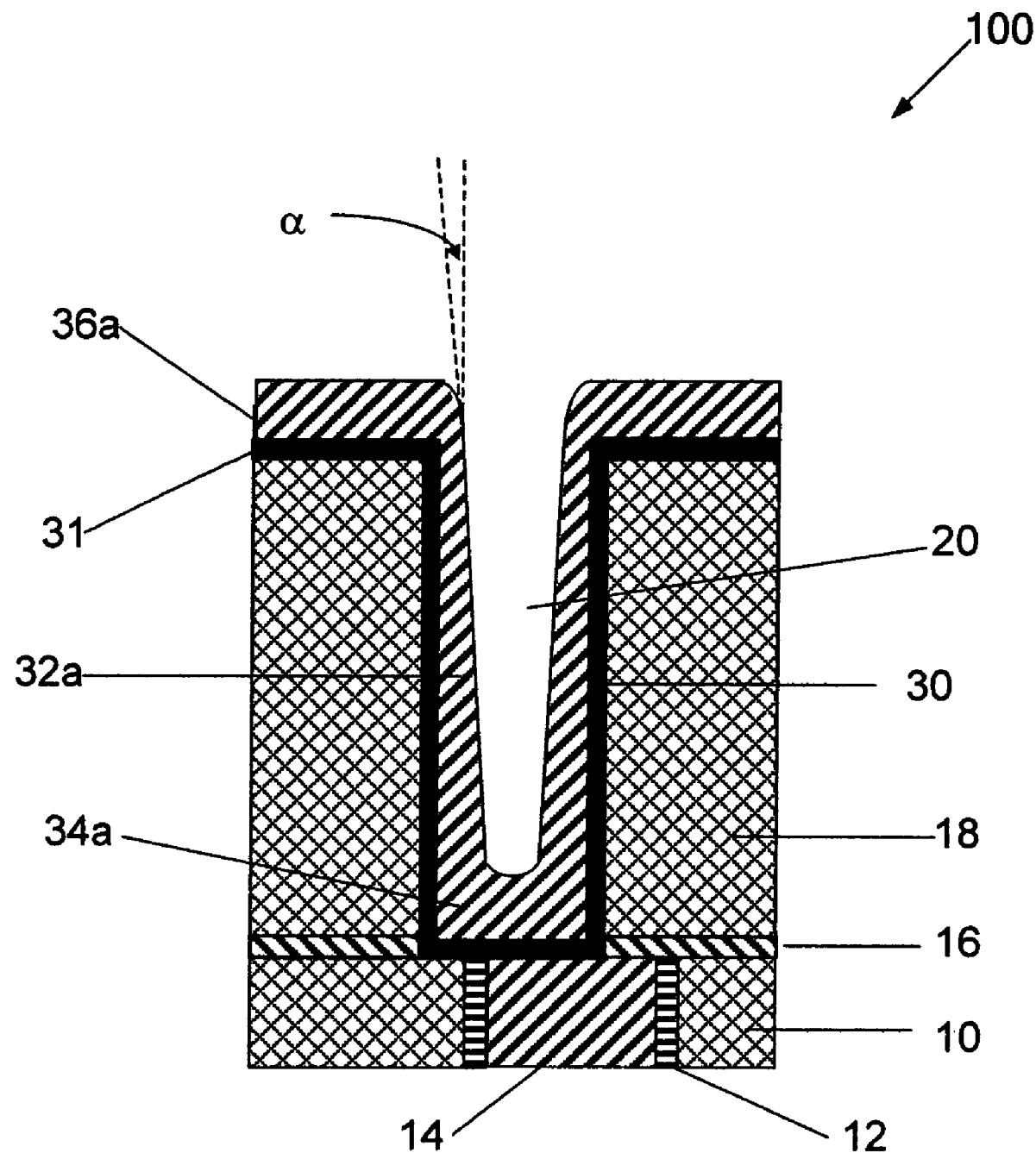
FIG. 9 illustrates the magnified schematic cross sectional view of the top portion of a substrate wafer, with part of the dielectric layer etched to form a trench, after copper diffusion barrier deposition and in the initial stages of copper deposition by processes described in the present invention in which rate of deposition on the bottom of the dielectric layer is higher than the rate of deposition on the side walls.

FIG. 9 shows the magnified schematic cross sectional view of the top portion of a substrate wafer with a trench structure 100 already fabricated on its surface as the topmost layer and subsequent to a perfectly conformal and highly uniform deposition of copper diffusion barrier layer 30, part of copper diffusion barrier on the top substrate wafer surface 31 and a thin layer of copper 32a on the vertical walls of the trench gap 20 and a thin layer of copper 34a at the bottom of the trench gap 20 and a thin layer of copper 36a on the top of copper diffusion barrier 31. The preferred process of deposition of copper is selected from the group of processes comprising PEM deposition or a PECVD process, depending upon the feature size with high rate PECVD process usually being generally employed for larger gap-structures. Moreover, the overall copper deposition process step can be a combination of one or more processes selected from the group comprising of PEM and PECV processes. Although the copper layer is simultaneously deposited on all three surfaces of the trench structure 100, the reason for assigning an individual numeral for each of them will soon become apparent. More specifically, FIG. 9 illustrates the schematic cross section of the early stages of copper thin film deposition process in which the rate of copper film deposition at the bottom of the trench gap 20 is higher than the rate of deposition of copper film on the vertical walls of the trench gap 20 due to directionality in the film deposition towards the bottom of the trench gap 20, that is inherent to a plasma assisted or plasma enhanced deposition process which will be described later. As a result, surface of the copper thin film 32a within the trench gap 20 develops a slope with respect to the vertical wall of the trench gap 20 that is characterized by angle α. It should be noted here that the angle α, which is a function of time during film deposition process, will change as the process progresses further.

The ALD processes of deposition of elemental copper films have been described before. These include, but are not limited to, reduction of cuprous chloride (CUCI) by $H_2$ between the temperatures of 300-350° C. as published by Martensson et al. in Chemical Vapor Deposition, volume 3, No. 1, p. 45-50 (1997).

In-situ generation of cuprous chloride (CuCl) is described in the U.S. patent application Ser. No. 10/975,169; and also its reduction of in an active hydrogen plasma was described in the U.S. patent application Ser. No. 10/865,111; to achieve lower deposition temperature as well as to eliminate, to the maximum extent, the possibility of inclusion of undesirable chlorine impurities within the film. The reaction mechanism for Plasma Enhanced Monolayer (PEM) deposition for copper with CuCl and hydrogen plasma is herein proposed as follows:

  (8)

  (9)

  (10)

  (11)

Here, the suffix ads means a surface adsorbed entity. It is well-known that hydrogen adsorbs on transition metals through dissociation (equation 8) and CuCl preferentially adsorbs on such a site (equation 9). Next, chlorine is removed by direct protonation (equation 10) and the copper surface is immediately terminated by hydrogen species in plasma (equation 11) to allow repetition of equations 9-11 in a cyclic manner.

However, thermodynamic considerations of some of the competing reactions are significant in the overall mechanism of copper ALD. These reactions have critical bearing on the ALD reactor design and its operational parameters. These are as follows:

  (12)

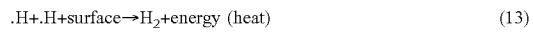  (13)

  (14)

Molecular hydrogen is known to readily dissociate as it chemisorbs on a variety of clean transition metals to form a metal—H bond, however, on copper surface (equation 12) it proceeds with an activation energy of 60 kJ/mol as described by Martensson et al., in Chemical Vapor Deposition, vol. 3, No. 1, p 48, 1997. Also, undesirable surface recombination of hydrogen radicals (equation 13) is a well-known process. Thus effective hydrogenation of a copper surface would only be possible through active H species to overcome the activation energy barrier and also their presence in sufficiently large quantities is necessary to overcome their surface recombination within the etched trench gap 20.

Such considerations for the copper ALD process described in equations (8-14) add to requirements of a proper reactor design to generate and distribute active H plasma species over the entire substrate surface with high efficiency and also impart a highly desirable measure of directionality to the copper film being deposited in the trench gap 20. The effective concentration of active, plasma generated hydrogen species within the narrow etch gap structure 20 can be modulated with process parameters such as, but not limited to, plasma power, substrate bias and process pressure. These process parameters also help maintain sufficient concentration of reactive atomic and ionic hydrogen species within the narrow features. Referring again to FIG. 9, in the proposed copper PEM deposition process, a continuous hydrogen plasma may be maintained within the reactor and copper precursor flow may be pulsed. Alternatively, both hydrogen plasma and copper precursor may be pulsed. Also, such a process sequence can also be suitably performed in continuous flow PECVD mode (hydrogen and copper precursor flow both maintained constant) to obtain high rate of deposition for larger dimension features where thicker copper film is required. Also, subsequent to completion of copper deposition process, the substrate wafer can be annealed, if necessary, in-situ, in hydrogen plasma to further reduce any inclusion of halogen atoms within the bulk of the film. To an individual skilled in the art of thin film processing, such a thin film process of impurity gettering in a reactive gas flow is known. Also, it should be noted herein that the process of deposition of copper either in pulse flow mode or in a continuous flow mode is not limited to its halide precursor only, as described in equations 12-14, but can be achieved by other suitable precursors such as $Cu(hfac)_2$, $C(thd)_2$ among others.

Figure 10:
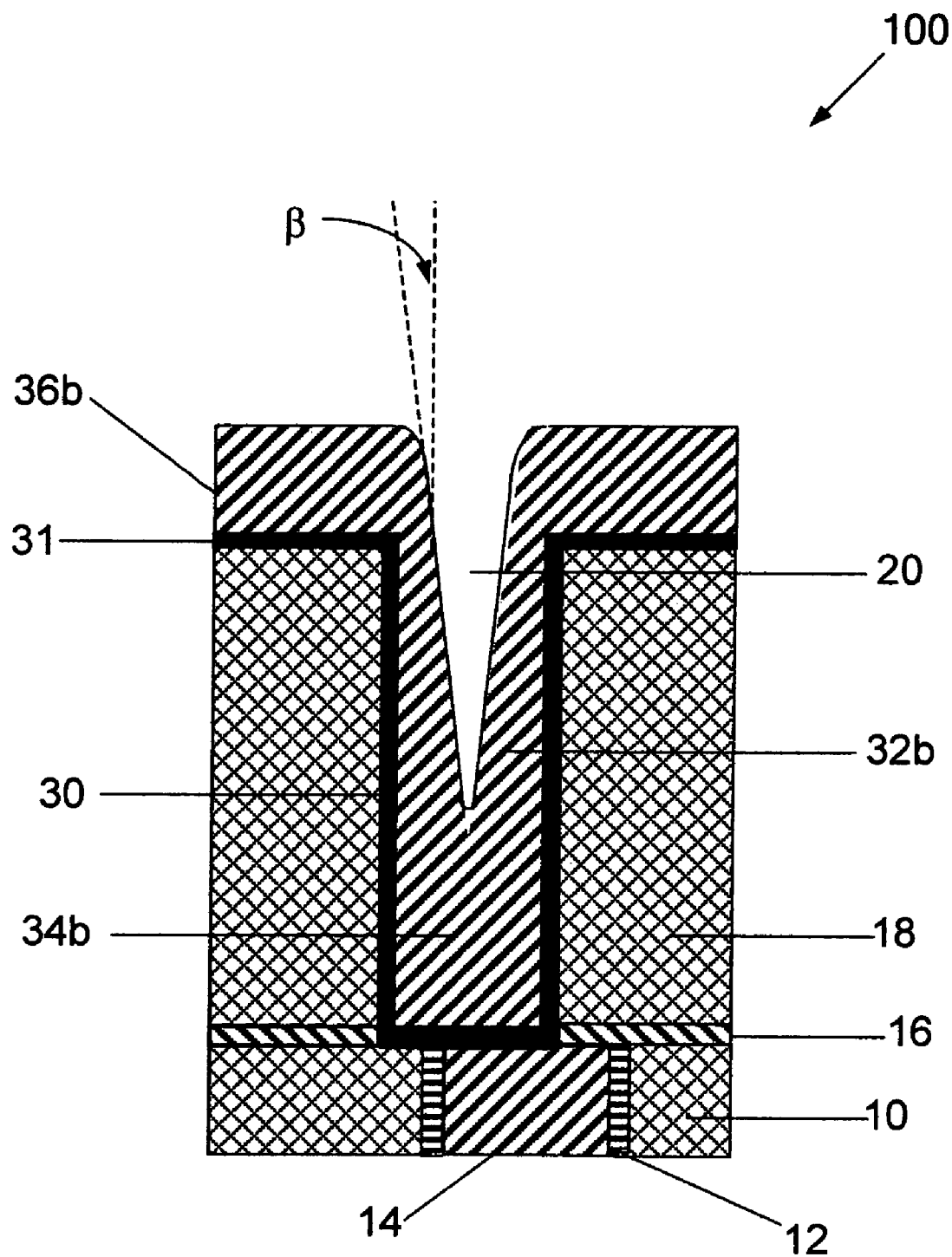
FIG. 10 illustrates the magnified schematic cross sectional view of the top portion of a substrate wafer, with part of the dielectric layer etched to form a trench, after copper diffusion barrier deposition and in the intermediate stages of copper deposition by processes described in the present invention in which deposition thickness on the bottom of the trench is larger than the deposition thickness on the side walls of the trench.

FIG. 10 illustrates the magnified schematic cross sectional view of the top portion of a substrate wafer, with part of the dielectric layer etched to form a trench, after copper diffusion barrier deposition and in the intermediate stage of copper deposition by processes described in the present invention in which deposition thickness on the bottom of the trench is higher than the deposition thickness on the side walls of the trench. More specifically, FIG. 10 shows the progression in the process of deposition of copper layer in the trench gap 20 after some definite elapsed time from the initial stage of copper thin film deposition as shown in FIG. 9. A thicker layer of copper 32b on the vertical walls of the trench gap 20 and a thicker layer of copper 34b at the bottom of the trench gap 20 and a thicker layer of copper 36b on the top of copper diffusion barrier layer 31 is built up. Simultaneous copper film deposition on the sidewalls (inward growth) and the film deposition on the bottom (upward growth) leads to the overall growth direction for the surface of the copper thin film 32b within the trench gap 20 to develop a slope with respect to the vertical wall of the trench gap 20, characterized by angle β. It should be noted here that the angle β is greater than angle α.

Figure 11:
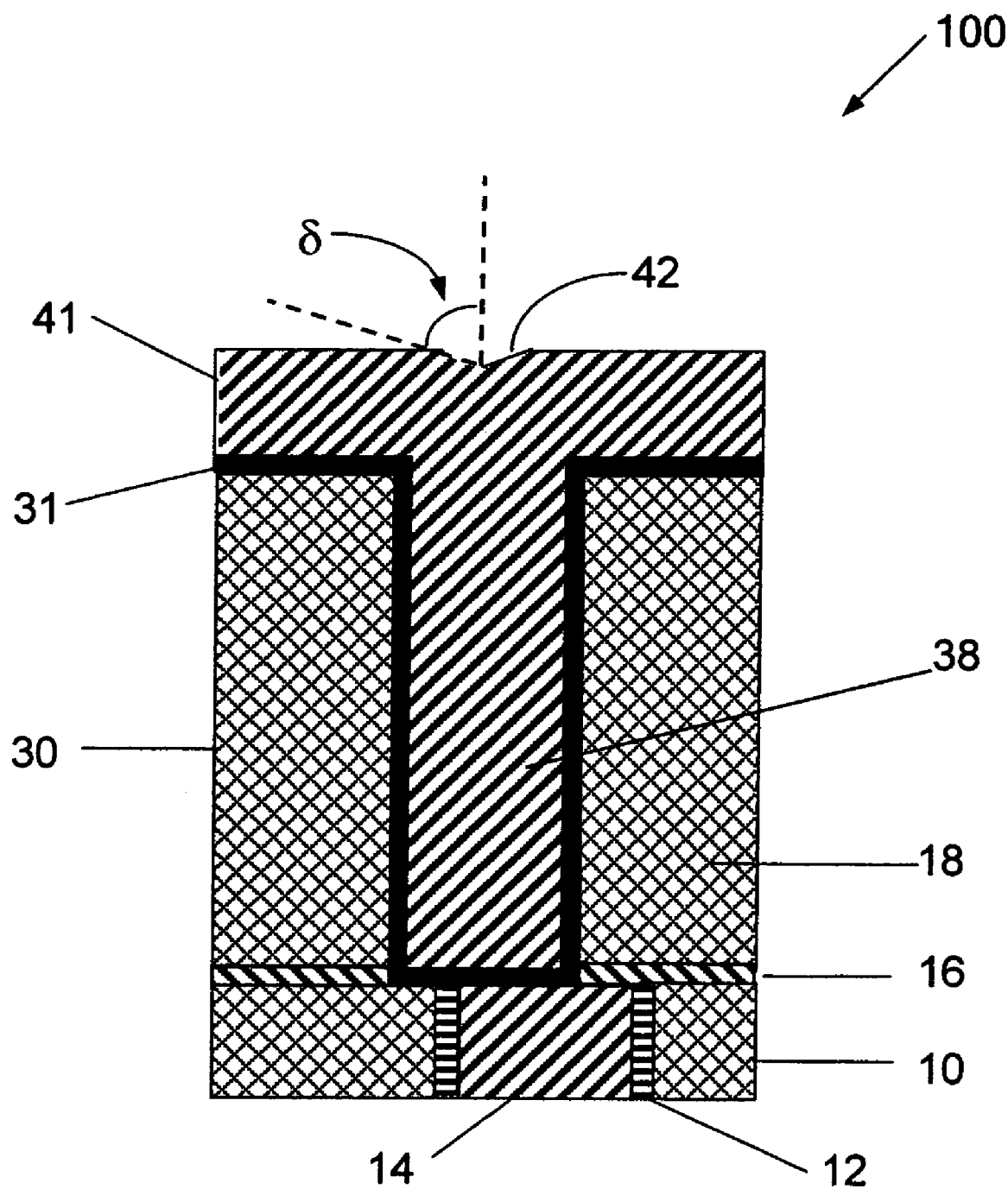
FIG. 11 shows the magnified schematic cross sectional view of the top portion of a substrate wafer, with part of the dielectric layer etched to form a trench and after copper diffusion barrier deposition and complete copper gap fill of the trench accomplished by the processes described in the present invention.
Figure 12:
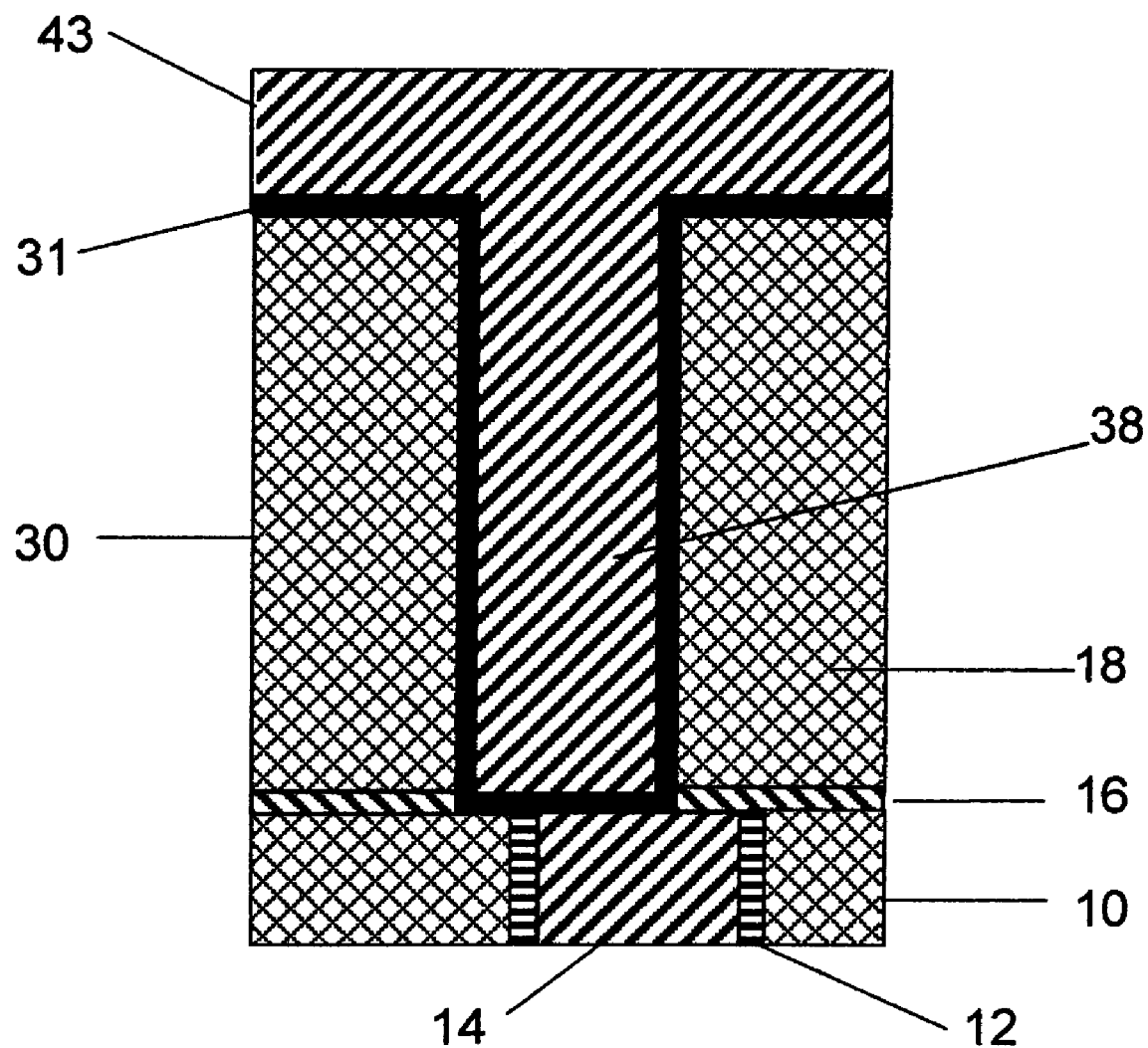
FIG. 12 shows the magnified schematic cross sectional view of the top portion of a substrate wafer, with part of the dielectric layer etched to form a trench and after copper diffusion barrier deposition as shown in FIG. 11 and after additional layers of copper deposited on the top to completely eliminate any trough formation to achieve a planarized top surface by the processes described in the present invention

FIG. 11 shows results of the continuation of the copper ALD process that leads to complete filling of trench gap 20 by a solid copper plug 38 and a top copper layer 41. It is emphasized here that the rate of deposition of the copper layer on the bottom of the trench gap 20 and the rate of deposition of copper layer being deposited on the side walls is simultaneously and continuously modulated throughout the process time needed to fill the trench gap 20 by a solid copper plug. Moreover, the nature of copper deposition can be changed from pulsed type to high rate continuous flow type within the time span of gap-filling process. However, it is highly desirable to obtain a complete gap filling while maintaining the thickness of the top copper layer 41 to a minimum possible, the reasons for which will soon become clear. The overall copper deposition process delivers a solid copper plug 38 with the top layer 41 with a shallow trough 42 on the surface of top layer 41 such that the surface of the shallow trough 42 makes an angle δ with respect to vertical wherein α<β<<δ. In order to ensure that no cavity, pinhole or a dimple is formed on the top surface at the end of copper deposition PEM or PECVD process, several additional layers of copper film are deposited to fill a shallow trough 42 and to obtain a flat surface. The final deliverable of the overall process sequence described above is a complete, void-free filling of the trench structure 100 by copper plug 38 in the trench gap 20 along with a substantially flat surface of top the copper layer 43 without any pinhole or cavity on the top as shown in FIG. 12. Selection of copper deposition process either by pulse flow or by continuous flow mode or a combination thereof is mainly determined depending upon the physical dimensions of the etched gap structures. For larger gap structures (e.g., via or trench), a high rate PECVD or CVD process is usually employed to achieve practical and economical throughput. Thus in order to achieve the desired results efficiently, without removing the substrate wafer from the processing reactor, a flexible operation PEM/PECVD reactor is highly desirable.

During the process of copper deposition, the substrate wafer is maintained at a suitably high temperature in the range of 100-300° C., whereas the reactor walls of the copper process reactor and its inner surfaces that are exposed to the reactive gaseous flows are maintained at a substantially lower temperature, in the range of 10-40° C., in order to suppress back diffusion of adsorbed chemical species from reactor walls on to the substrate wafer and also to reduce the chemical precursor consumption by surface chemical reactions on the walls of the reactor.

Figure 13:
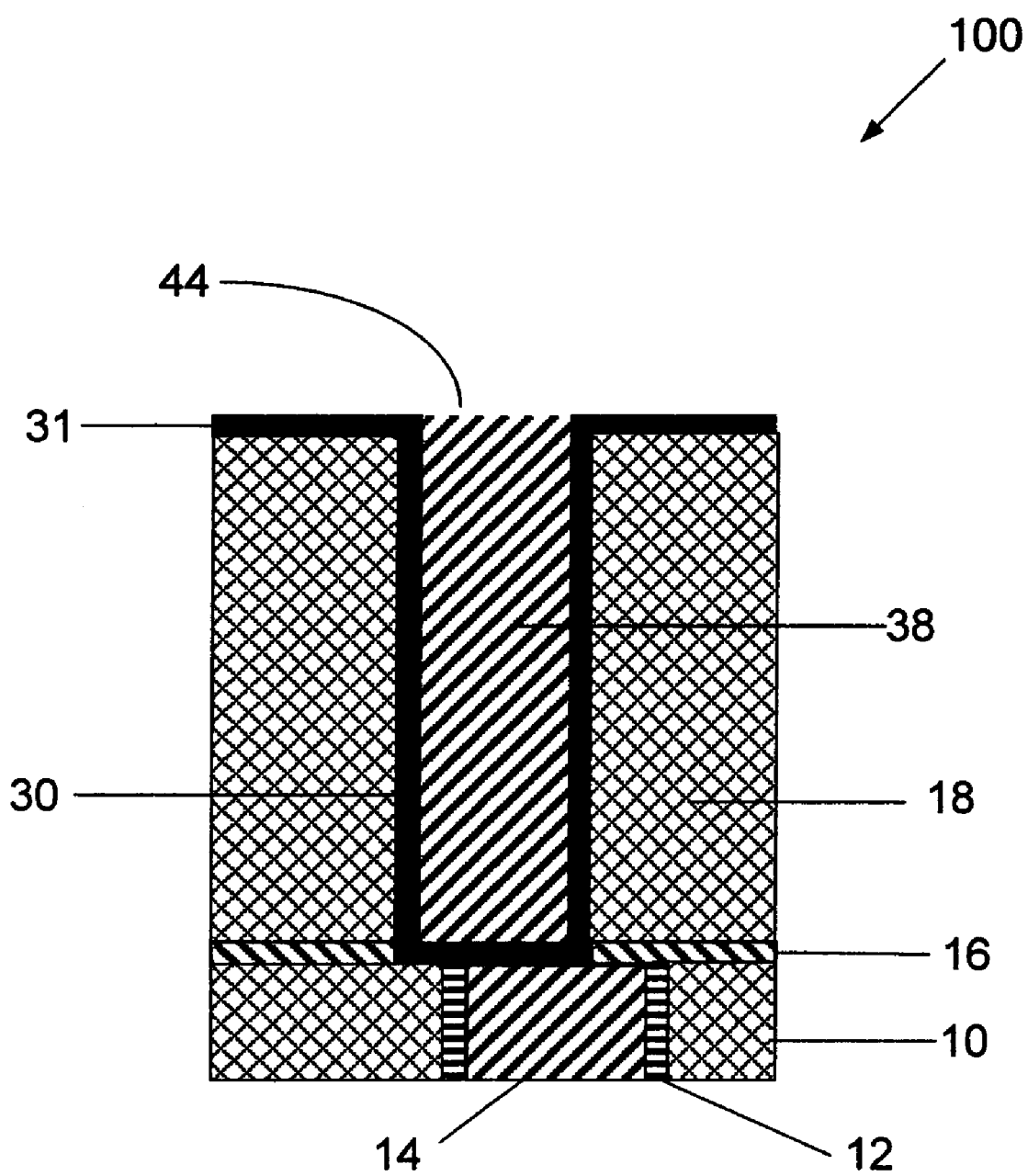
FIG. 13 illustrates the magnified schematic cross sectional view of the top portion of the substrate wafer, with part of the dielectric layer etched to form a trench and after complete copper gap fill of the trench and subsequent to excess top copper layer removal process exposing the filled copper structures and blanket barrier according to the present invention.

Subsequently, the substrate wafer is further processed within the same substrate processing reactor (the second substrate processing reactor) to remove the top copper layer 43 on the top surface of the substrate wafer as shown in FIG. 13. Subsequent to the complete removal of blanket copper layer 43 by vapor phase process, a new patterned copper surface 44 of the filled copper layer 38 and the previously deposited diffusion barrier layer 31 surface are exposed. The vapor phase removal process to remove the top copper layer 43 may be run in a discrete flow (in pulse flow mode such as ALD or PEM) or in high rate continuous flow mode, e.g. in chemical vapor processing mode which may be assisted by plasma. The most plausible vapor phase chemical etching reaction to remove copper described below is well-known in the art and are based on oxidation of the heated copper surface by a suitable oxidizer (oxidizing agent) such as oxygen, chlorine or bromine employed either in a molecular form or as an excited species (from plasma)—for example, chlorine plasma/copper reaction as described by Sangehon Lee and Yue Kuo in the Journal of Electrochemical Society, volume 148, page G524-G529, September 2001 and rapid thermal oxidation of copper thin films as described by Yao Zhi-Hu et al., in the Journal of Electrochemical Society, volume 148, page G669-G675, December 2001. The oxidation of copper is followed by the reaction of oxidized copper with a suitable chelating agent e.g., H⁺hfac as described by Huo et al., in the Journal of Materials Research, vol. 17, No. 9, p. 2394-2398 (September 2002) to form a volatile copper chelate. Furthermore, one or more chelating agents, for example but not limited to, H⁺thd, tmvs, may be simultaneously employed to form volatile chelates. The volatile copper chelate is then removed from the vicinity of the copper surface under the combined action of vacuum and supplied heat energy. The pertinent chemical reactions for copper removal can be conveniently carried out at temperatures between 75° C. to 200° C. and reactor operating pressure between 100 mT to 5 Torr range. The pertinent chemical reactions for copper removal are summarized below:

$$Cu(0)+X/.X \rightarrow CuX/Cu_2X \quad (15)$$

$$Cu_2X+2HL \rightarrow Cu(II)L_2+2HX \quad (16)$$

$$CuX+HL+HM \rightarrow Cu(I)LM \quad (17)$$

Here X is an oxidizer such as oxygen, chlorine, bromine, iodine or a mixture thereof. The chemical compounds HL and HM are the chelating agents that react with oxidized or halogenated copper to form a volatile chelate. As an example, L=hfac, thd etc. and M=tmvs. The molecular species (chelate) Cu(I)LM and Cu(II)L₂ are both volatile under the reactor operating conditions of pressure, temperature and flow. It is emphasized here that one or more vapor phase chelating agents HL and HM may be simultaneously employed to achieve the reactions as described in equations (16) and (17) to facilitate copper removal. Subsequent to vaporization of the copper chelate, fresh surface of underlying copper is exposed and the processes as described in equations (15) through (17) are repeated until the top copper layer 43 is completely removed. The process of copper removal, described in equations (15) through (17) can also be carried out in a continuous flow mode to achieve high-rate of removal.

Referring back to FIGS. 4A and 4B and FIGS. 5A and 5B, it is essential to reemphasize here that filling of trench gap 20 must be without any seam or void. During vapor phase removal of the blanket copper layer 43, a seam or a void (a defect), formed within the trench gap 20 during a conformal gap filling process, can facilitate access of reactive chemicals into the bulk copper within the trench gap 20. In such instance, with progress of chemical reactions described in equations (15) through (17), the seam or void (a defect) will rapidly begin to widen and the process of copper gap filling can unravel altogether which is extremely undesirable. It is thus essential to form a defect free copper gap fill layer. Therefore, conformal mode of vapor phase gap filling, which generates a seam, and its subsequent in-situ vapor phase are quite unsuitable.

During copper deposition, the temperature of inner surfaces exposed to the substrate wafer of the second wafer processing reactor is maintained within 10-40° C., which leads to accumulation of un-reacted copper precursor of copper deposition reactions on these surfaces. However, during the vapor phase removal process of the top copper layer 43 (FIG. 12), temperature of the coated inner surfaces of the second wafer processing reactor is raised along with the substrate wafer, but maintained suitably at temperatures below 100° C., such that vapor phase copper removal reactions as described in equations (15) through (17) also are initiated on these surfaces and accelerated to an acceptable rate. This ensures simultaneous and effective cleaning of the inner surfaces of the copper deposition reactor and helps running of the second substrate wafer processing reactor in a quasi-clean mode.

Figure 14:
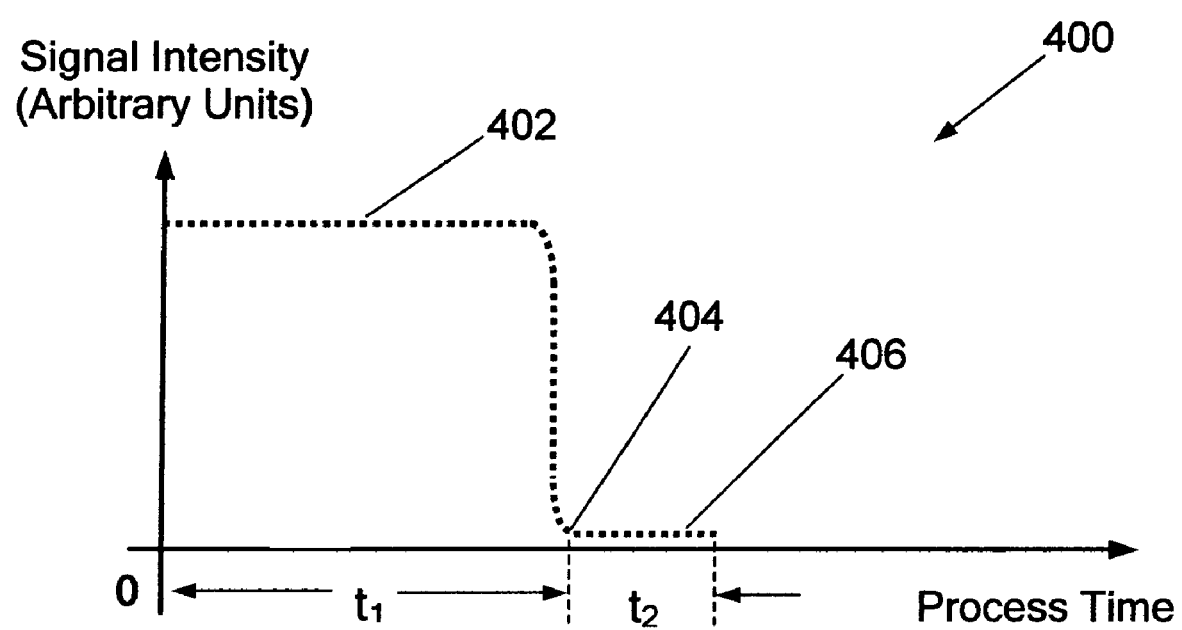
FIG. 14 shows the change in magnitude of the signal of a detection instrument used to detect the end of the process for removal of a layer.

FIG. 14 describes the detection of removal copper in the vapor phase by a suitable detecting instrument with process time. Such an instrument can be in the form of a residual gas analyzer, commonly known as RGA, which detects copper atoms in vapor phase by mass spectrometry. The magnitude of mass/charge ratio signal for copper is proportional to the concentration of copper in vapor phase. A typical RGA graph 400 of the copper concentration with respect to time is shown in FIG. 13. During vapor phase copper removal process, in which blanket copper layer 43 is being removed, the detection signal magnitude is designated a value 402 that is almost constant with elapsed process time $t_1$. Subsequent to complete removal of the blanket film, a composite substrate wafer surface with a large fraction of the top diffusion barrier layer 31 and a very small fraction of copper layer surface 46 is exposed, which signifies the end of process and the copper detection signal drops sharply to its new magnitude 404. The removal process can then be optionally run for time=$t_2$ beyond the end point time $t_1$, such that $t_2 < t_1$ to ascertain complete removal of blanket copper layers from the top of the substrate wafer surface. A constant copper detection signal magnitude of 406 is established and the copper removal process is terminated at time $t=t_1+t_2$. Although, RGA has been used as an example of the copper detection and measurement system in the vapor phase, any other measurement technique such as optical emission spectroscopy is equally applicable and appropriate and should offer similar detection and measurement results with respect to the end-of-process.

Referring to FIG. 13, the substrate wafer, with a composite surface made of copper surface 44 and copper diffusion barrier 31, is treated for the removal of the copper diffusion barrier 31 from the top surface of the substrate wafer. For this process step, the substrate wafer is transferred to the first substrate processing reactor wherein the copper diffusion barrier 30 and 31 were deposited. A variety of vapor phase chemical schemes to achieve isotropic or anisotropic etching of various diffusion barriers such as Ta, TaN, $WN_x$, $WSiN_x$, are well known to an individual ordinarily skilled in the art. The most common and suitable being etching achieved by ions and radicals of halogen species such as fluorine, chlorine and bromine or a suitable combination thereof, in which the metallic constituent of the diffusion barrier material is converted in to a volatile product and removed from the vicinity of the surface. A few examples are in order such as (a) etching of tungsten and tungsten nitride using $SF_6/Ar$ plasma as described by Reyes-Betanzo et al., in the Journal of Electrochemical Society, volume 149, page G179-G183, March 2002 (b) high rate tantalum etching in an atmospheric downstream plasma containing $CF_4/O_2/He$ as described by Tu et al, in the Journal of Vacuum Science and Technology A, volume 18, page 2799-2805, November/December 2000.

In summary, the chemical processes involved in removal of copper diffusion barrier layer 31 by conversion of its constituents into volatile metal halides (and silicon chloride) which can be summarized as shown below (for sake of simplicity, the chemical equation is not balanced):

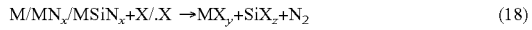

$$M/MN_x/MSiN_x + X/.X \rightarrow MX_y + SiX_z + N_2 \qquad (18)$$

Here, M=W, Ti, Ta etc. and X=F, Cl, Br and I.

Figure 15:
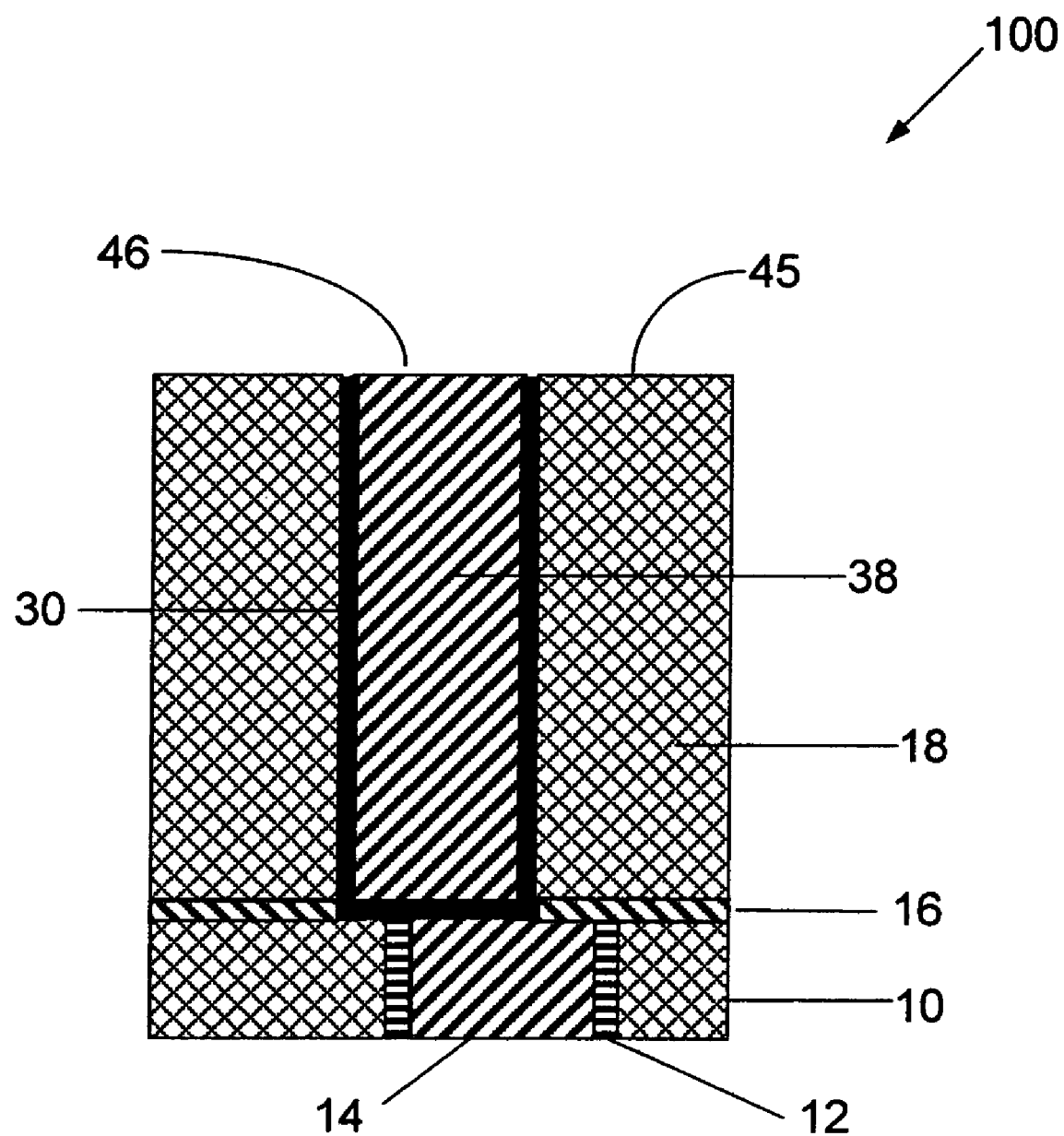
FIG. 15 shows the magnified schematic cross sectional view of the top portion of the substrate wafer with a single damascene structure, after diffusion barrier deposition, and subsequent to copper gap fill and excess top copper layer removal and after complete top copper diffusion barrier removal process according to the present invention.

The end of process of copper diffusion barrier removal can be suitably detected by following a similar procedure as described in FIG. 14. Referring to FIG. 15, subsequent to the removal of top layer of the diffusion barrier 31, surface 45 of the trench dielectric 18 and the top surface 46 of copper layer 38 are exposed. During the removal process of copper diffusion barrier layer 31, the top surface 46 of the copper layer 38 and the top surface 45 of trench dielectric 18 are chemically affected e.g., are halogenated or oxidized, as described in equation (15), which is undesirable.

Referring to FIG. 15 again, in order to repair the chemically converted top surface 45 of the trench dielectric and the top surface of copper layer 46, due to halogenation or oxidation, the substrate wafer is transferred to the third wafer processing reactor for surface modification, where one or both of the following chemical schemes are employed. Chemical scheme (a): The nature of the top surface, due to reaction of elemental copper with halogen to form $CuX_2$ (X=F, Cl, Br or I) in general and $CuF_2$ in particular, if fluorinated compounds are employed to remove the copper diffusion barrier substrate wafer surface, is composite in nature due to presence of surfaces 45 and 46, active hydrogen plasma consisting of $H^+$ and .H radicals is employed to remove adsorbed fluorine. The chemical reaction can be described as:

$$\text{Surface-F} + H^+/.H \rightarrow \text{Surface-H} + HF \qquad (19)$$

$$CuX/CuX_2 + H^+/.H \rightarrow Cu + 2HX \qquad (20)$$

$$CuO/Cu_2O + H^+/.H \rightarrow Cu + H_2O \qquad (21)$$

Here, X=F, Cl, Br and the top wafer substrate surface is referred to as a composite surface comprising surface 45 and surface 46. Halogenated or oxidized surface of copper 46 and fluorinated or oxidized surface of dielectric 45 can both be effectively repaired by a chemical reaction as described in equations (19)-(21).

Alternative chemical scheme: Halogenation or oxidation of metallic copper surface 46 during the diffusion barrier 31 removal by halogens can lead to formation of copper halide ($CuX_2/CuX$, X=Cl, Br or I) on the surface of the copper layer 38. The chemical processes described in the equations (16) and (17) above to remove copper halide by chelation are employed to remove halogenated copper.

Figure 16:
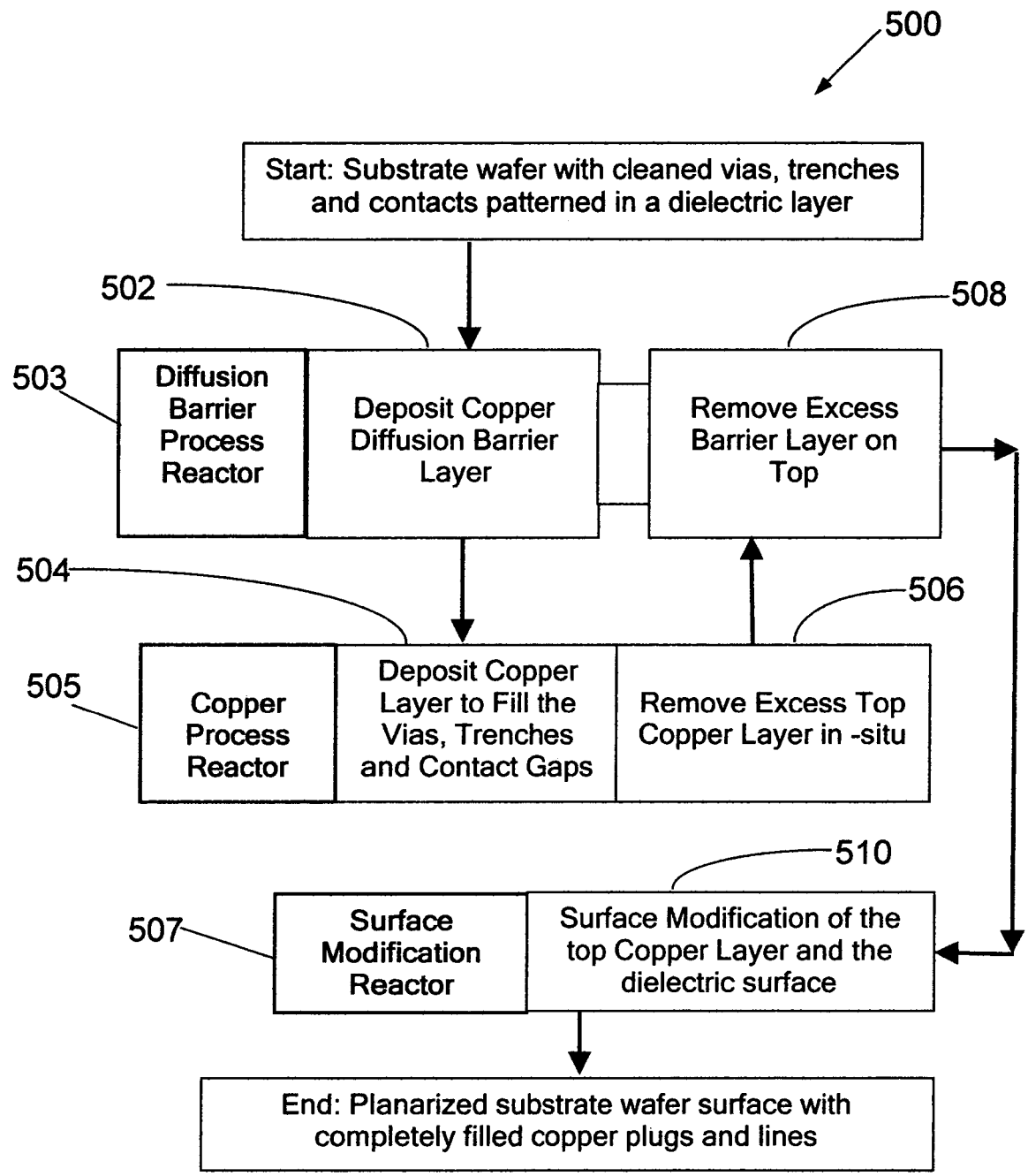
FIG. 16 illustrates a flow chart of the process sequence and substrate wafer transfer procedures within the multi-reactor cluster tool during complete processing of one level of copper interconnect metallization.

FIG. 16 illustrates the sequence scheme 500 of the substrate wafer during the deposition and etching processes as shown in FIGS. 8 through 12 and FIG. 14 and FIG. 15 to achieve one complete interconnect level of metallization with a trench gap structure. The substrate wafer is processed through three distinct processing reactors, by processes described in equations (1) through (10) that are capable to operate either in pulsed mode or in a continuous mode, with or without active plasma, of processing with varying degree of processing speed and precision. The substrate wafer with an etched trench gap structure 100, as shown in FIG. 1, is the starting point of the process sequence. Copper diffusion barrier is deposited on the substrate wafer in step 502 in the diffusion barrier reactor 503. Next, copper fill is achieved in step 504 by transferring substrate to the copper process reactor 505. Further to this, in the same reactor 505, the top copper layer is removed in-situ, without removing the substrate wafer in step 506, to expose the copper—diffusion barrier composite surface. Next, the substrate wafer is transferred back to reactor 503 and process 508 of removal of the top layer of the diffusion barrier. Finally, the substrate wafer is transported to the surface modification reactor 507 to carry out the process 510 of removal (or conversion) of chemically modified copper surface from diffusion barrier etching and the substrate is sent out for further processing, e.g. to another reactor to deposit cap layer or etch stop layer e.g., $SiN_x$ or SiC.

Figure 17:
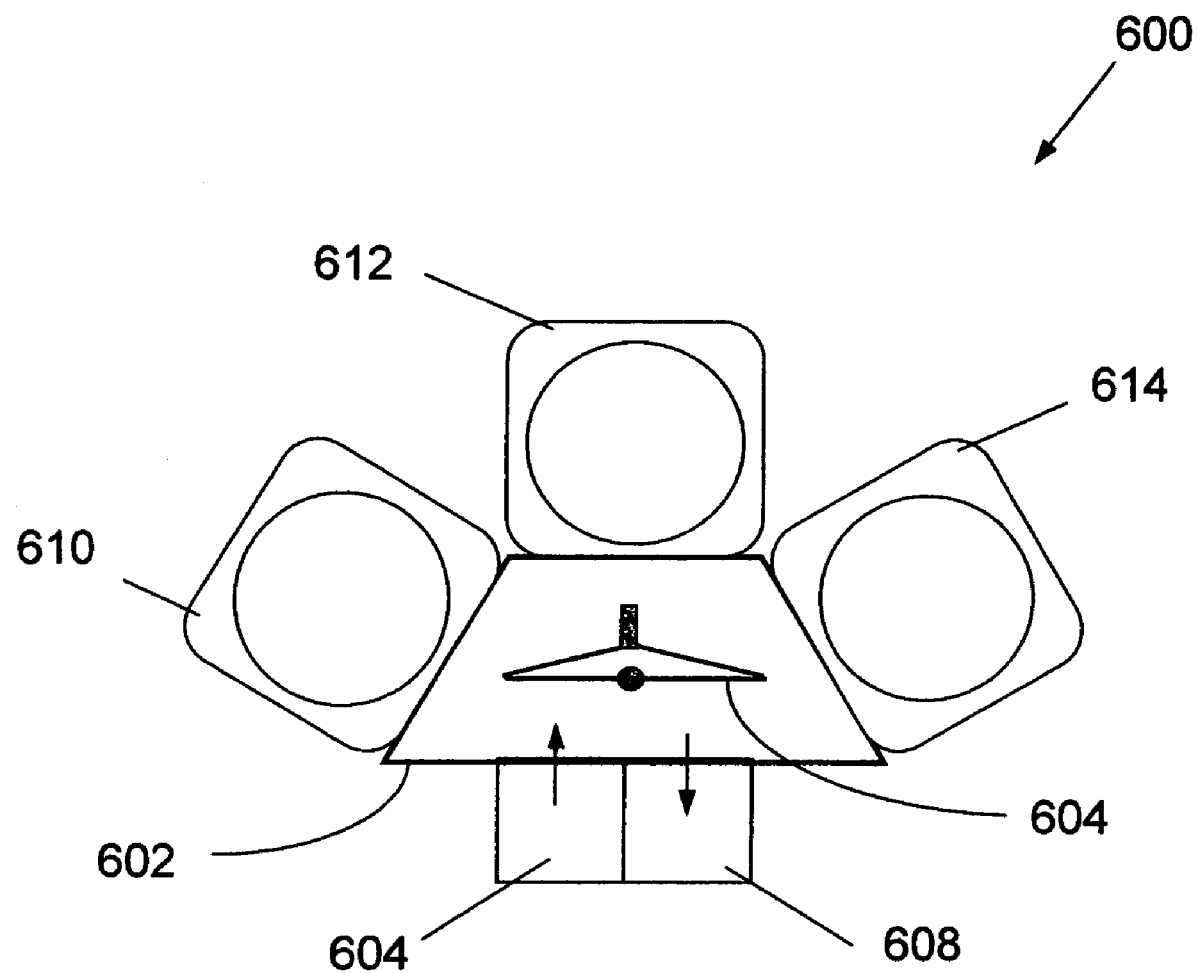
FIG. 17 shows the schematic of the cluster tool as described in FIG. 16, with central robotic handler to transfer substrate wafer, with three separate process reactors for the process sequence.

FIG. 17 illustrates a schematic of a cluster tool system 600 frequently employed in the large scale manufacturing of advanced electronic devices. The cluster system 600 consists of a central substrate wafer exchanger module 602, a remotely controlled robot handler 604 situated within the wafer exchanger module 602, substrate wafer loading station 606, substrate wafer unloading station 608 and an ALD/PEM reactor 610 dedicated for barrier processing, a PEM/PECVD reactor 612 dedicated for copper processing and an ALP/PEM reactor 614 dedicated for halogen removal from the composite surface of copper layer surface 46 and dielectric layer 45, attached to the side walls of the central substrate wafer exchanger module 602 through remotely operated pneumatic gates (not shown). The substrate wafer is transported from one reactor to the other by a remotely controlled robot handler 604 through remotely operated pneumatic gates (not shown) interposed between the central substrate wafer exchanger 602 and each of the substrate wafer processing reactors. In practice, the cluster tools systems may have more than three reactors attached to the central substrate wafer exchanger module for high efficiency operation. In such a case, the process that takes longer time as compared to the processes being run in other reactors, will be assigned multiple reactors that perform the same function and operate in parallel. As an example, it is estimated that copper processing is a longer recipe as compared to diffusion barrier processing, merely due to the thickness of the film to be deposited and removed, then it is advisable to incorporate multiple copper processing reactors in such a system.

EXAMPLE

Gap Fill and Etch-Back of Tungsten on Ti—TiN and WNx Barrier

Gap fill of elemental tungsten in an ALD mode can be achieved by employing hydrogen plasma containing active hydrogen species such as .H and H+, with tungsten hexafluoride ($WF_6$) as a tungsten source in an PEM or PECVD mode as described in the U.S. patent application Ser. No. 10/865,111 filed Jun. 9, 2004. Although the process chemistry for tungsten deposition is described with respect to $WF_6$ as the tungsten source, other tungsten sources such as $WCl_6$, $W(CO)_6$ are equally applicable. Chemical reactions for deposition of tungsten metal and its etch back by an active halogen (denoted by X in equation 24 below) plasma can be described as follows:

$$WF_6 + .H/H^+ \rightarrow W + HF \qquad (22)$$

$$WF_6 + .H \rightarrow W + HF + H_2 \qquad (23)$$

$$WNx + .X/X^+ \rightarrow WX_n + N_2 \qquad (24)$$

Here, n=4, and 6 and X is F, Cl, Br. For sake of simplicity, the reactions are not balanced.

Alternately, gas phase silyl species ($.SiH_3$) can be used effectively in lieu of activated hydrogen species to ensure efficient reduction of $WF_6$ adsorbed on the substrate surface to obtain tungsten layer.

$$WF_6 + .SiH_3 \rightarrow W + HF + SiF_4 \qquad (25)$$

The contact hole etched in the dielectric layer is first coated by a tungsten diffusion barrier layer such as titanium-titanium nitride (Ti—TiN), or a tungsten nitride ($WN_x$), which is also deposited by an ALD process. An ALD process for deposition of TiN barrier is described in equation (1). The ALD process chemistry for metallic titanium layer can be suitably developed by employing titanium halide ($TiX_4$, X=Cl, Br, and I) and active hydrogen plasma species as follows:

$$TiX_4 + .H/H^+ \rightarrow Ti + 4HX \qquad (26)$$

The contact hole is first lined with Ti/TiN bi-layer or a $WN_x$ barrier layer. subsequently the contact hole is completely filled by tungsten and excess tungsten on the top surface, along with the titanium/titanium nitride (or tungsten nitride) layer on the top planar surface is etched back in isotropic mode by employing a halogen plasma, generated in-situ by a suitable plasma source. While the top tungsten layer on the substrate wafer is being etched back, simultaneously the undesirable tungsten deposition on the inner walls of the chamber is also cleaned. Such a process sequence allows the integration of process steps and operation of the substrate processing reactors for barrier processing (in this case Ti—TiN) and metal processing—tungsten deposition to operate in a quasi-clean mode.

Thus it has been shown that the present invention provides a method of manufacturing a gap-filled structure of a semiconductor device, which is eliminates the need for electrochemical or electroless deposition, as well as for subsequent planarization, e.g., by means of CMP or electro-chemo-mechanical polishing of copper. The invention, although described in detail for a trench gap (single damascene), is applicable for dual damascene and other geometries such as contact holes etc. that are routinely employed in a multi-level metallization scheme. More importantly, copper removal without mechanical force is extremely beneficial and desirable in protecting the delicate low-k dielectric materials from damage, de-lamination of diffusion barrier layers and subsequent failure of the entire metallization scheme. The diffusion barrier layer may comprise carbides, nitride, silicides and oxides of metals such as Ru, Zr, Hf, Nb, Ta, Ti, W and Mo or one or more these metals in the elemental form or their alloys. More than two or three process chambers (reactors) can be combined into a cluster tool. Furthermore, pre-barrier deposition cleaning of sub-micron features and also the etch stop layer deposition processes can be effectively and economically carried out in multi-wafer stack reactors and such reactors may also be combined with the cluster tool. Also, in addition to copper, the invention is equally applicable to vapor phase deposition and removal of semiconductors e.g. silicon or insulators such as $SiN_x$, $SiO_2$ etc., as well as other conductors such as tungsten and aluminum for gap fill and planarization. As an example, the gate level dielectric material such as borophosphosilicate (BPSG) or phosphosilicate (PSG) glass or $SiO_2$ (silica) layer can be filled in the gap between two adjacent gate stacks. Also, shallow trenches for electrical isolation between two adjacent transistors can be filed with $SiO_2$ and planarized in-situ by employing the process sequence of gap-fill and in-situ planarization as outlined in this invention. Although the invention has been shown and described with reference to specific embodiments, it is understood that these embodiments should not be construed as limiting the areas of application of the invention and that any changes and modifications are possible, provided these changes and modifications do not depart from the scope of the attached patent claims.

I claim:

1. A method of filling a recess in the surface of an object comprising the steps of:
   providing a plasma enhanced monolayer processing apparatus having a working chamber, at least a first chemical supply unit for the supply of a first chemical agent and a second chemical supply unit for the supply of a second chemical agent into said working chamber, said first chemical agent and said second chemical agent reacting with each other to produce a deposition material;
   placing said object with top surface and recess into said plasma enhanced monolayer processing apparatus;
   said recess having side walls surface and bottom surface;
   supplying said first chemical agent and said second chemical agent to said working chamber;

causing a reaction between said first chemical agent and said second chemical agent for producing reaction products that contains said deposition material; wherein the rate of deposition of said material on said bottom surface of said recess and said top surface of said substrate is higher than the rate of deposition of said material on said side walls surface of said recess;

evacuating said working chamber for removing said reaction products except said deposition material;

depositing said deposition material into said recess by a process selected from plasma enhanced monolayer deposition and plasma enhanced chemical vapor deposition for decomposing at least one of said first chemical agent and said second chemical agent in order to deposit said deposition material in the form of a deposited layer of varying thickness onto said surfaces and into said recess;

filling said recess by a process selected from plasma enhanced monolayer deposition and plasma enhanced chemical vapor deposition; continuously depositing said deposition material by said plasma enhanced chemical vapor deposition and by repeating said step of depositing said deposition material by said plasma enhanced monolayer deposition process until said recess is completely filled, said deposited layer on said top surface having a thickness being greater than the half of said width of said recess.

* * * * *